United States Patent [19]

Umino

[11] Patent Number: 5,885,366

[45] Date of Patent: Mar. 23, 1999

[54] METHOD FOR WASHING OILY SOIL FROM OBJECTS

[75] Inventor: Makoto Umino, Tokyo, Japan

[73] Assignees: Hakuyosha Co., Ltd., Tokyo; Nippon Shokubai Co., Ltd., Osaka, both of Japan

[21] Appl. No.: 695,691

[22] Filed: Aug. 12, 1996

Related U.S. Application Data

[63] Continuation of Ser. No. 429,186, Apr. 26, 1995, abandoned.

[30] Foreign Application Priority Data

Apr. 28, 1994 [JP] Japan ........................ HEISEI6-111875

[51] Int. Cl.$^6$ ............................... B08B 7/00; C23G 5/028
[52] U.S. Cl. ........................... 134/40; 510/365; 510/412; 510/475; 510/476
[58] Field of Search .................................. 134/2, 38, 40; 510/175, 285, 291, 365, 412, 426, 475, 476

[56] References Cited

U.S. PATENT DOCUMENTS

| | | | |
|---|---|---|---|
| 5,089,152 | 2/1992 | Flynn et al. | 252/194 |
| 5,401,429 | 3/1995 | Flynn et al. | 134/40 X |
| 5,403,514 | 4/1995 | Matsuhisa et al. | 134/40 |
| 5,458,692 | 10/1995 | Flynn et al. | 134/40 X |
| 5,484,489 | 1/1996 | Flynn et al. | 134/40 |
| 5,514,221 | 5/1996 | Bolmer | 134/40 |
| 5,536,327 | 7/1996 | Kaier | 134/1 |
| 5,552,080 | 9/1996 | Bolmer | 510/412 |
| 5,593,507 | 1/1997 | Inada et al. | 134/11 |

*Primary Examiner*—Lyle A. Alexander
*Assistant Examiner*—Saeed Chaudhry
*Attorney, Agent, or Firm*—McGlew and Tuttle

[57] ABSTRACT

A washing method for removing oily soil from an object stained therewith by contacting the object with a non-flammable washing agent composition comprising 0.001 to 30 parts of a fluorine-free absorbent which can absorb and capture oily soil and not less than 70 parts of perfluorocarbon liquid to remove the soil from the object.

17 Claims, 10 Drawing Sheets

Fig. 3 The relation between the concentration of surfactant and the soil redeposition for every amount of water Fig. 9  The relation between the temperature of the washing agent and the washingability in the presence and absence of oil-absorbent A filtration process of the washing agent

METHOD FOR WASHING OILY SOIL FROM OBJECTS

This is a divisional application of application Ser. No. 08/429,186 filed Apr. 26, 1995 and now abandoned.

BACKGROUND OF THE INVENTION

1. Field of the Invention

The invention relates to a novel washing agent and a washing method utilized for laundry, dry-cleaning, and washing of electronic parts, circuit substrates, precision machines, etc.

2. Description of the Prior Art

In conventional washing methods, water has been used to remove water-soluble soil effectively in laundry since washing was begun historically. However, garments made of material apt to sustain damages such as shrinkage and loosing their trim appearance resulting from the use of water, such as wool and silk are treated with dry-cleaning. Various washing agents are properly used taking damages given to garments into consideration, for example, perchloroethylene, organic solvents etc. which are effective in removing oily soil are employed for dry-cleaning, and CFC-113 which can retain good feeling or garments, and petroleum solvents are also employed properly. Powder cleaning using powdered corn core, etc. and shampoo cleaning utilizing foams are also known.

BRIEF SUMMARY OF THE INVENTION

Conventional laundry is effective for removing water soluble soil such as sweat on products made of natural materials and water absorbent fibers such as recycled fibers. At ambient temperature, however, water used takes a form of liquid thought to be resulting from association in spite of its small molecular weight of 18. Thus, its intermolecular strength is strong, leading to very strong surface tension. This makes it difficult for water to penetrate into fibers rapidly. As a result of the combination use of surfactants, contact duration, and physical powers, however, water easily enters into rough regions in fibers such as amorphous regions after penetration to swell the fibers, since the molecular diameter of water is small.

Higral expansion (swelling of fibers) thus occurs in cellulose fibers and animal fibers to cause shrinkage of fabrics. In addition, in woolen fabrics, a scale covering the fiber surface opens and the physical strength during washing significantly enhances intertwining among scales to cause felting. In the case of silk fabrics, the sheen of the surface is easily lost due to lousiness defects which are caused by splitting of micro-fibers (fibril) on the fiber surface. In the case of synthetic fibers such as polyester, the fibers are swollen by temperature and solid particles easily enter into rough fiber regions to cause soil redeposition. Accordingly, fibers are swollen to cause shrinkage, changes in forms, and damages such as changes of feelings of products as mentioned above.

Then, a dry-cleaning method using organic solvents was developed as a washing method which did not cause swelling of fibers. Organic solvents are non-polar and thus their water solubility is very low. Organic solvents generally employed at present have molecular weights of 133.5–187.5, much higher than that of water, and thus do not penetrate into fibers and do not swell fibers. Among the organic solvents, perchloroethylene is most frequently used, which has a strong ability to remove oily soil, that is to say, a large KB value (kauri-butanol value). Some fiber products, however, undergo various finishing treatments to improve properties of the fibers, some fibers contain oil and fat in themselves such as wool, and some use pigment print or chemicals dissolved in solvents with a high KB value as sub-material, which are not infrequently found. They are damaged to lose their product values when they are washed with perchloroethylene with a large KB value, since the above-mentioned treatment materials are removed together with oily soil.

Although water-soluble soil and oily soil are easily removed by laundry and dry-cleaning, respectively, as mentioned above, insoluble soil such as solid particles remain as other soil. Since such insoluble soil is attached to garments by a difference between the electric repulsion and the van der Waals attraction, it should be removed by reducing the power or giving energy larger than the power.

Then, soil which is hardly removed by laundry and dry-cleaning is removed by surfactants, alkaline adjuvants, or addition of physical strength such as agitation. Surfactants possess hydrophilic groups and hydrophobic groups simultaneously in one molecule. When they are placed in solvents, they form molecular agglomerates (micell), in which the solvent soluble regions stay outside and the solvent insoluble regions stay inside. The properties inside the micell are just opposite to those of solvents. Thus, surfactants can dissolve organic solvents when the solvent used is water, whereas they can dissolve water when the solvents used are organic solvents (solubilization). The solubilized solvent dissolves undissolved soil to remove it. It is natural that a soil removal rate depends on the physical strength and amounts and kinds of additives, and the cleanness evaluated varies. Therefore, although solvents which can remove soil as thoroughly as possible are desirable, it is also important that they do not damage the washing.

Various values required to be taken into consideration for solvent are shown in Table 1, which shows the various values required to be considered for solvents.

The solvents underlined in the table are problematic for use. Among them, CFC-113, fluorocarbon solvent, has been used as a relatively mild solvent for dry-cleaning. It was identified, however, as a causal substance of destruction of the ozone layer, greenhouse effects, etc. and its production will be banned in 1995. Requirements for solvents are diverse as shown in Table 1. Solvents for laundry using water are clearly different from those for dry-cleaning using organic solvents. There is a correlation between washing strength and damage of the washing, that is to say, when a soil removal rate becomes higher, damage by water or organic solvents also becomes larger.

Since garments emphasizing fine feeling have recently been increased due to propagation of high-graded products, petroleum solvents and CFC-113 with a mild resin-solubility (chemical power) have been increasingly employed. Even such solvents possess some resin solubility and may damage garments, although their KB values are smaller than that of perchloroethylene. In addition, since petroleum solvents have strong inflammability as shown in Table 1, it is difficult to use such solvents in city areas. They are toxic. They also require time to be dried due to their boiling points, resulting in problems of possibility of damaging garments during a drying step and productivity. Since all of them are organic solvents, they dissolve some resins and plasticizers. Although HCFC-225, HCFC-141b, etc. can be mentioned as other alternative Freons, they cannot be adopted, like the case of CFC-113, since their step-wise reduction or banning has also been decided and since they may spoil some resins.

Therefore, laundry is used for washing which can be washed with water and dry-cleaning with perchloroethylene is employed for washing which is not affected by solubility of organic solvents. For other washing, it is desired to avoid use of dry-cleaning which has a strong possibility of using petroleum solvents with ambiguous abilities, relatively mild organic solvents, and CFC-113, and instead treat with liquid with a KB value of 0.

The inventors of the present invention have found perfluorocarbon liquid as a result of extensive investigation on substances without solubility, which is one of defects of laundry and dry-cleaning, which eliminate chemical damage to the washing. Perfluorocarbon liquid has a KB of 0. Perfluorocarbon liquid is merely a medium to disperse soil coming from the washing almost without dissolving anything and possesses properties to eliminate a dissolving power (damage) to the washing. This liquid includes a series of perfluorocarbon liquids such as perfluoroalkanes ($C_nF_{2n+2}$) such as perfluorohexane $C_6F_{14}$, perfluoroheptane $C_7F_{16}$, and perfluorooctane $C_8F_{18}$, and perfluorocycloalkanes, and perfluoromorpholine compounds such as perfluoro-N-methylmorpholine $C_4F_8ONCF_3$.

The present inventors utilize properties of the perfluorocarbon liquid and found washing agents which can remove water-soluble soil and oily soil by combining the perfluorocarbon liquid as washing agents with various surfactants, various absorbents, oil adsorbents, surfactants, and their combinations and an excellent method of removing oily soil by using the same.

The purpose of the present invention is to provide a washing agent which is not inflammable and safe for the environment and which can remove water-soluble soil, oily soil, and insoluble soil, by the perfluorocarbon liquid, a combination of specific surfactants, or a combination of the perfluorocarbon liquid with specific polymer absorbents, oil-adsorbents and organic solvents and to provide a washing method using the washing agent.

The washing agent to remove water-soluble, oily, and insoluble soil by using perfluorocarbon liquid together with anionic surfactants and/or nonionic fluorocarbon surfactant, or their combination and the washing method using the washing agent according to the present invention are explained below.

Table 2 shows the comparison among perfluorocarbon liquids.

Although the perfluorocarbon liquid is considered as a kind of fluorine-contained organic solvents in a broader sense, we decided to designate them as liquid not as solvent since they lack in a dissolving power. Fluorine-contained organic liquid generally comprises any of hydrogen (H), chlorine (Cl), fluorine (F) and carbon (C) atoms, among which fluorine and carbon atoms are essential. Molecules composed of chlorine, fluorine, and carbon are stable in the air, and dispersed into the ozone layer where they are decomposed by ultraviolet rays and chlorine atoms contained in them act as a catalyst to decompose ozone into oxygen molecules. Thus, production of these compounds will be prohibited soon. CFC-113, one of solvents for dry-cleaning, belongs to the above-mentioned group. HCFC in which a part of chlorine atoms are substituted with hydrogen atoms and HFC in which all chlorine atoms are substituted with hydrogen atoms are not sufficiently effective as dry-cleaning solvents as shown in Table 2. For example, HCFC-225 has a solubility parameter, which can deduce solubility of resins, between 7.5 and 10, where the most soluble resins belong, thus dissolves acrylic resins, etc. easily. HCFC-114b has a low boiling point leading to difficulty in storage, and a high solubility. HCFC-114b's ozone-destruction power is not zero, thus its production will also be prohibited in the near future. p The perfluorocarbon liquid of the present invention is a series of perfluorocarbon liquids such as perfluoroalkanes ($C_nF_{2n+2}$) such as perfluorohexane $C_6F_{14}$, perfluoroheptane $C_7F_{16}$ and perfluorooctane $C_8F_{18}$, and perfluorocycloalkanes, and perfluoromorpholine compounds such as perfluoro-N-methylmorpholine $C_4F_8ONCF_3$.

Surfactants are concomitantly used with the perfluorocarbon liquids. The surfactants are fluorocarbon surfactants including anionic surfactants and nonionic surfactants.

Anionic surfactants such as potassium N-alkyl-N-sulfate perfluoroalkylsulphonamide with a chemical structure:

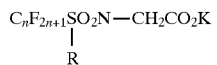

nonionic surfactants such as N-alkyl-N-polyoxyethelene perfluoroalkylsulphonamide with a chemical structure:

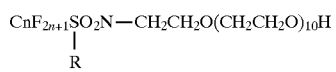

Unidine DS-403 (Daikin Kogyo), perfluoroalkyl ethyleneoxide adducts, with a structure:

$CnF_{2n+1}$—O—$(CH_2CH_2O)m$—H

EFTOP EF-351 (Tohkem Products), polyoxyalkylene ($C_{2-3}$) alkylether acrylate N-perfluorooctylsulphonyl-N-alkylaminoethyl acrylate copolymer:

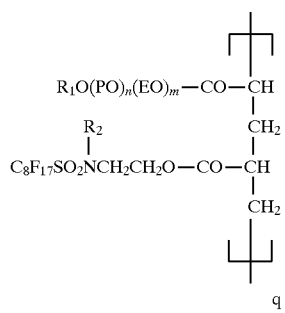

wherein, $R_1$ and $R_2$ represent alkyl groups;

PO represents an oxypropylene group; and

EO represent an oxyethylene group; or the both was added at 0.2 wt %, respectively.

The mixture 301 was poured into the dry-cleaning apparatus shown in FIG. 10 and water was added to adjust the concentration to 500 mg/l. As an oil-absorbent, 150 g of Oil-absorbent PW-170 (Nippon Shokubai), a flourine-free oil-absorbing polymer comprising of 2-ethylhexyl acrylate as a monomer (A) and 1,9-nonandiol diacrylate as a cross-linking monomer (B) was used. Total 3 kg of white cloth made of wool, cotton and polyester at a weight ratio of 7:1:2 and artificially stained (water-soluble, oil-soluble, and insoluble) clothes which had been moisturized under 65% R.H. at 20° C. were washed under conditions of a solvent temperature 20°±2° C. and a washing agent flow rate of 30 l/min for 30 minutes. The washing rates and soil redeposition rates are shown in Table 3, together with the data till 1995, since CFC-113 is an ozone destruction substance.

CFC-113 can be employed, however, at present. Thus, during that period, the amount of CFC-113 reduced can be compensated with perfluorohexane.

Amphoteric surfactants can be added to the above-mentioned surfactants or other cation surfactants can be optionally added to the nonionic surfactants to adjust feelings of the washing.

When perfluoroalkanes ($C_nF_{2n+1}$) are used in the perfluorocarbon liquid, those with n=7–10 are employed. When water is added, perfluoroalkanes with n=7–8 are used, and when organic solvents are added, those with n=9–10 are used.

(Experiment 1)

To the perfluorocarbon liquid, a perfluoromorpholine compound, Unidine DS-403 (Daikin Kogyo), a fluorocarbon nonionic surfactant, a perfluoroalkylethyleneoxide adduct with a structure of:

$CnF_{2n+1}$—O—$(CH_2CH_2O)_m$—H; and

EFTOP EF-351 (Tohkem Products), polyoxyalkylene ($C_{2-3}$) alkylether acrylate N-perfluorooctylsulphonyl-N-alkylaminoethyl acrylate copolymer with a structure:

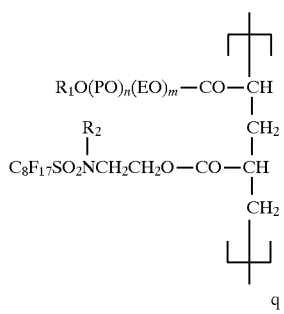

wherein, $R_1$ and $R_2$ represent alkyl groups;

PO represents an oxypropylene group; and

EO represent an oxyethylene group; can be mentioned.

The amounts of the washing agent to be employed depend on conditions of soil and influence of the washing to water or organic solvents, but in general, composed of 99.999–94 parts of the perfluorocarbon liquid, 5–0.001 parts of surfactant and 1–0 part of water, or 99.99–50 parts of the perfluorocarbon liquid, 30–0.001 part of absorbents, and 20–0 parts of organic solvents such as perchloroethylene are employed. For example, 0–3,000 mg/l of water or 0–3,000 mg/l of organic solvents such as perchloroethylene is added in a solubilized or as emulsion form. The washing is washed for 1–15 minutes, spindle-dried and then dried at about 50° C. with hot wind for 10–15 minutes.

The amount of CFC-113 allowed to be utilized will be reduced for other solvents for comparison.

The following artificially stained clothes were employed:

Cloth stained with water-soluble soil:
Water solution in which edible pigment violet No.1 and C.M.C. had been dissolved were evenly attached to polyester cloth was then dried spontaneously.

Cloth stained with oily soil:
Tallow, liquid paraffin, and oil red were dissolved in carbon tetrachloride in which white woolen clothes were soaked. After the soil was evenly attached on the clothes and the clothes were dried spontaneously.

Cloth stained with insoluble soil:
Ten kinds of test dust (JIS-Z8901) were dispersed in water, in which white cotton cloth was immersed. After the soil was attached, the clothes were dried spontaneously.

Washing strength and soil redeposition were evaluated as follows.

Y values of CIE'S tristimulus values for the stained clothes and white clothes were measured by a calorimeter (Suga Shikenki) prior to and following washing and the washing rate (%) and soil redeposition rate (%) were calculated according to the following equations:

Wash rate (%) =

$$\frac{(Y \text{value after washing} - Y \text{value before washing})}{Y \text{value of original white cloth} - Y \text{value before washing}} \times 100$$

Soil redeposition rate (%) =

$$\frac{\left( \begin{array}{c} Y \text{value of white cloth before washing} - \\ Y \text{value of white cloth after washing} \end{array} \right)}{(Y \text{value of white cloth before washing})} \times 100$$

Table 3 shows the washing rates and soil redeposition rates (Experiment 2)

Special garments and attachments which cause trouble by washing with perchloroethylene or Freons 113 due to dissolution or ablation were washed with a perfluoromorpholine compound as the perfluorocarbon liquid and the results were compared with those obtained for perchloroethylene or Freons 113.

The washing conditions were identical to those employed in Experiment 1. The results are shown in Table 4, which shows the results of solvent resistance tests of special garments and attachments Then, we found a washing agent which can remove water-soluble soil and oily soil by a combination use of the perfluorocarbon liquids of the present invention and various absorbents, oil adsorbents, and surfactants which are effective as washing agent. A washing method with a good performance to remove oily soil using the above-mentioned washing agent is explained.

Since the perfluorocarbon liquid is inactive, its exclusive use provides only insufficient washing effective for washing out water-soluble and oily (containing 50% of oil with a solubility parameter (SP value) of 11 or lower) soil. Therefore, absorbents and organic solvents such as perchloroethylene, or water and surfactants were added to enhance washing ability and soil redeposition prevention ability for oily and water soluble soil. Solubilities of oily substances and water-soluble substances can be altered by changing amounts and combination of these additives to achieve washing suitable for the washing.

Absorbent (II) employed in the present invention is at least one fluorine-free oil absorbing agent selected from a group consisting of oil absorbing polymers (IV) which can be obtained by polymerizing monomer components which contain not less than 50 wt % of monomers (A) which mainly comprise monomers with a solubility parameter (SP value) not higher than 9 and contain at least one polymerizing group containing an aliphatic hydrocarbon having 3–30 carbon atoms in a molecule; oil absorbing polymers comprising polynorbornene, styrene butadiene copolymer, sulphonated ethylene propylene terpolymer, etc.; synthetic polymer absorbents comprising polypropylene, polyethylene, polystyrene, polyurethane, etc.; and/or oil adsorbents such as inorganic compounds comprising activated carbon, silica, zeolite, diatomaceous, activated alumina, montmorillonite (acidic clay), acid-treated montmorillonite (activated clay), halloysite, allophane, Attapulgite, kaolin, talc, pectolite, saponite, Stephensite, bentonite, Sepiolite, and agalmatolite.

The oil absorbing polymers (IV) employed in the present invention can be any oil absorbing polymers which are obtained by polymerizing monomer components containing not less than 50 parts of monomers (A) which mainly comprise monomers with a solubility parameter (SP value) not higher than 9 and contain one polymerizing group in a molecule, without any limitation. When monomers with a solubility parameter (SP value) larger than 9 are used as main components of monomers (A), polymers with a high oily soil (I) absorbing ability cannot be obtained, thus the ability to prevent soil redeposition to the washing may be reduced or duration of preserving an exchange ability of oil absorbing polymer (IV) may be shortened.

Solubility parameter (SP value) is generally used as standard exhibiting porality of compounds. In the present invention, a value obtained by substituting a cohesive energy constant of Hoy for a calculation formula of Small is applied. Its unit is expressed by $(Cal/cm^3)^{1/2}$ Polymerizing groups of the monomer (A) which contains one polymerizing group in a molecule and has a solubility parameter (SP value) not higher than 9 used in the present invention may be any polymerizing group, without any limitation, which can polymerize the oil absorbing polymers through polymerization reaction such as radical polymerization, radiation-induced polymerization, addition polymerization, polycondensation polymerization. Among them, monomers containing unsaturated polymerizing group are particularly desirable, since oil absorbing polymers can be produced conveniently in an industrial scale through radical polymerization of the polymerizing unsaturated groups.

Monomers which contain one polymerizing unsaturated group in a molecular and which have a solubility parameter (SP value) not higher than 9 are unsaturated carboxylates such as methyl (meth)acrylate, ethyl (meth)acrylate, butyl (meth)acrylate, t-butyl (meth)acrylate, 2-ethylhexyl (meth) acrylate, n-octyl (meth)acrylate, dodecyl (meth)acrylate, isobornyl (meth)acrylate, stearyl (meth)acrylate, phenyl (meth)acrylate, octylphenyl (meth)acrylate, nonylphenyl (meth)acrylate, dinonylphenyl (meth)acrylate, cyclohexyl (meth)acrylate, menthyl (meth)acrylate, polyalkyleneglycol mono(meth)acrylate, alkylpolyalkyleneglycol mono(meth) acrylate, poly(di)alkylsiloxane mono(meth)acrylate, dibutylmaleate, didodecyl maleate, dodecyl crotonate, didodecyl itaconate; (meth)acrylamide containing hydrocarbon groups such as (di)butyl (meth)acrylamide, (di)dodecyl (meth)acrylamide, (di)stearyl (meth)acrylamide, (di) butylphenyl (meth)acrylamide, (di)octylphenyl (meth) acrylamide; α olefins such as 1-hexene, 1-octene, isooctene, 1-nonene, 1-decene, and 1-dodecene; alicyclic vinyl compounds such as vinylcyclohexane; allylether containing hydrocarbon groups such as dodecylallylether; vinyl ester containing hydrocarbon group such as vinyl caproate, vinyl laureate, vinyl palmitate, and vinyl stearate; vinyl ether containing hydrocarbons such as butylvinylether and dodecylvinylether; aromatic vinyl compounds such as styrene, t-butylstyrene, and octylstyrene. One or more kinds of these monomers can be used.

Among them, as the monomer (A) providing more excellent oil-soil absorbing ability in addition to the performance mentioned above, those which have at least one aliphatic hydrocarbon group containing 3–30 carbon atoms and which mainly comprise at least one unsaturated compound (a) selected from a group consisting of alkyl (meth)acrylate, alkylaryl (meth)acrylate, alkyl (meth)acrylamide, alkylaryl (meth)acrylamide, alkylstyrene and α-olefin are preferable.

The monomers (A) with a solubility parameter (SP value) not higher than 9 constitute not less than 50 wt %, preferably not less than 70 wt % of a total amount of the monomers (A). It is not preferable that the monomers with a solubility parameter (SP value) not higher than 9 constitute less than 50 wt % of a total amount of monomer (A), since polymers with a high oily soil (I) absorbing ability cannot be obtained, thus the ability to prevent soil redeposition to the washing may be reduced or duration preserving an exchange ability of the oil absorbing polymer (IV) may be shortened.

Therefore, the monomer with a solubility parameter (SP value) not higher than 9 must be contained at 50 wt % or higher proportions in the monomers (A). The monomers with a solubility parameter (SP value) higher than 9, however, may be incorporated in the monomers (A) at a proportion lower than 50 wt %. Examples of such monomers include (meth)acrylic acid, acrylonitrile, anhydrous maleic acid, fumaric acid, hydroxyethyl (meth)acrylate, polyethyleneglycol mono(meth)acrylate, and methoxypolyethyleneglycol (meth)acrylate.

The oil absorbing polymers to be used in the present invention are those which can absorb oily soil (I) regardless of the presence and absence of cross-linkage. In order to control oil-absorbing rate and to prevent redeposition of the washing by dissolution of the oil absorbing polymer in oily soil (I) perfluorocarbon solvents (III), it is more preferable to contain not higher than 4 wt % (0.001–4 wt %) of the cross-linking monomers (B) which contain at least 2 polymerizing unsaturated groups in a molecule together with 96 wt % or higher (96–99.999 wt %) of monomers (A) which contain one polymerizing unsaturated group in a molecule and which mainly comprise the monomers with a solubility parameter (SP value) not higher than 9 (a sum of monomers (A) and monomers (B) should be 100 wt %).

As cross-linking monomer (B) used in the present invention, for example, ethyleneglycol di(meth)acrylate, diethyleneglycol di(meth)acrylate, polyethyleneglycole di(meth)acrylate, polyethyleneglycol-polypropyleneglycol di(meth)acrylate, polypropyleneglycol di(meth)acrylate, 1,3-butyleneglycol di(meth)acrylate, neopentylglycol di(meth)acrylate, 1,6-hexanediol di(meth)acrylate, N,N'-methylene bis(meth)acrylamide, N,N'-propylene bis(meth) acrylamide, glycerine tri(meth)acrylate, trimethylolpropane tri(meth)acrylate, tetramethylolmethane tetra(meth)acrylate, polyfunctional (meth)acrylate obtained by esterification of alkyleneoxide adducts of polyols (such as glycerine, trimethylolpropane and tetramethylolmethane), (meth)acrylic acids and divinyl benzene can be mentioned. One or more kinds of such cross-linking monomers can be used.

A ratio between the monomer (A) and the cross-linking monomer (B) in the monomer components used in the production of the oil absorbing polymers (IV) is preferably such that the monomer (A) constitutes 96.0–99.999 wt % and the monomer cross-linking (B) constitutes 0.001–4 wt % of a sum of the monomer (A) and cross-linking monomer (B).

When the monomer (A) constitutes less than 96 wt % or the cross-liking monomer (B) constitutes over 4 wt %, the cross-linking polymer obtained has an excessive cross-linking density. Thus, polymers with a high oily soil absorbing ability cannot be obtained, leading to reduction of absorbing efficiency and higher cost. Thus, it is not preferable. On the other hand, when no cross-linking monomer (B) is added, a gel strength of the cross-linked polymer which have absorbed oily soil decreases, resulting in difficult absorption and bad filtration. Thus, it is also not preferable.

The above-mentioned monomer components can be polymerized using polymerization initiators or catalysts to produce the oil-absorbing polymers (IV). Polycondensation can be performed by light such as ultraviolet rays, radiation, heat, etc. Polymerization may be performed by conventionally known methods such as suspension polymerization, block polymerization, and emulsion polymerization.

In suspension polymerization, monomer components are suspended in water by means of an emulsifier with a high HLB value or protective colloid such as polyvinylalcohol, hydroxyethylcellulose, and gelatin and polymerized in the presence of oil-soluble polymerization initiators. As polymerization initiators, for example, organic peroxides such as benzoyl peroxide, lauroyl peroxide, cumene hydroperoxide, and azo compounds such as 2,2'-azobisisobutyronitrile and 2,2'-azobisdimethylvareronitrile can be used. Preferable polymerization temperatures range from 0° to 150° C. Aqueous suspension of fine granulated resins of 10–1000 $\mu$m thus obtained are filtered and dried to give the desired oil-absorbing polymers (IV).

In block polymerization, for example, monomer components are poured into a mold in the presence of the above-mentioned polymerization initiators to proceed polymerization at 0°–150° C. to give desired oil-absorbing polymers (IV).

In emulsion polymerization, for example, anionic or nonionic or combined emulsifiers are used to suspend monomer components in water. Persulfates such as ammonium persulfate and potassium persulfate or water-soluble azo compounds as polymerization initiators, and if required, reducing agents, pH adjusting agents, anti-oxidants, anti-static agents are concomitantly used to proceed polymerization at 0°–150° C. to give the desired oil-absorbing polymers (IV).

In ring-opening polymerization, the desired oil-absorbing polymers (IV) can be obtained by emulsion polymerization in alcohol or water using indium, ruthenium, osmium, etc. as a catalyst, or a polymerization method using a metathesis catalyst.

The oil absorbing polymers (IV) employed in the method of absorbing oily soil according to the present invention can be any form including water-dispersant, granule, granulated product, packed oil-absorbent and porous oil absorbent.

For example, the oil absorbing polymer (IV) of the present invention may be granulated with various fillers and hydrophobic substances. Oil absorbents consisting of the oil absorbing polymer (IV) and metal salts of organic acid whose solubility in 100 g of water at 20° C. is not higher than 1 g according to Japanese Patent Application No. 147313 of 1992, and oil absorbents consisting of the oil absorbing polymer (IV) and hydrophobic inorganic compounds with a methanol value not lower than 25% such as hydrophobic silica according to Japanese Patent Application No.231390 of 1993 can be mentioned.

The oil absorbing polymers (IV) or its granulated products can be filled in a container made of oil-permeable material or supported in nonwoven fabrics for use. Oil absorbents in which the oil absorbing polymer (IV) is filled in hydrophobic porous container according to Japanese Patent Application No. 15286 of 1992; oil absorbents in which granules comprising the oil absorbing polymer (IV) and metal salts of organic acid with a solubility in 100 g of water at 20° C. not higher than 1 g is filled in container made of porous material according to Japanese Patent Application No. 230835 of 1992; porous oil absorbents in which oil absorbent comprising the oil absorbing polymer (IV) and hydrophobic inorganic compound with a methanol value not lower than 25% such as hydrophobic silica is filled in an oil permeable container according to No. 246491 of 1993; oil absorbents in which the oil absorbing polymer (IV) is supported on a hydrophobic porous substrate according to Japanese Patent Application No. 41583 of 1992; porous oil absorbents in which granules comprising the oil absorbing polymer (IV) and water-insoluble compounds are supported on a porous substrate according to Japanese Patent Application No. 56920 of 1993; and porous oil absorbents in which oil absorbent comprising the oil absorbing polymer (IV) and hydrophobic inorganic compounds with a methanol value not lower than 25% such as hydrophobic silica is supported on porous substrate according to Japanese Patent Application No. 308463 of 1993 can be mentioned.

Polymers containing at least one norbornene group can be mentioned as other preferable oil absorbing polymers, a representative examples of them are norbornene whose substitute is synthesized from ethylene and cyclopentadiene via Diels-Alder reaction, for example, dicyclopentadiene, tetracyclododecene, methyltetracyclododecene, ethylidenetetracyclododecene, hexacycloheptadecene, methylhexacycloheptadecene, tricyclopentadien, methylnorbornene, ethylidenenorbornen, vinylnorbornene, 5-methyl-2-norbornene, 5,6-dimethyl-2-norbornene, 5-ethyl-2-norbornene, 5-butyl-2-norbornene, 5-hexyl-2-norbornene, 5-octyl-2-norbornene, 5-dodecyl-2-norbornene.

Effects of the washing agent composition of the present invention can be obtained as follows: very small amount of oily soil (I) is dissolved in the perfluorocarbon liquid (III) and the oily soil (I) dissolved in the perfluorocarbon liquid (III) is absorbed by the absorbent (II). Therefore, the perfluorocarbon liquid (III) dissolves a very small amount of oily soil (I), since the perfluorocarbon liquid (III) acts as a mediator to transfer the oily soil (I) to the absorbent (II). Thus, redeposition of the oily soil (I) on the washing does not occur.

Absorbent (II) is preferably incorporated in the washing agent composition at 0.01–30 wt %, in order to wash oily soil (I), and sustain the effect without soil redeposition to the washing using the washing agent composition and in order to handle easily. It is not preferable that perfluorocarbon liquid constitutes less than 70 wt % or the absorbent (II) exceeds 30 wt %, since it causes inconvenience in mixing with the washing and circulatory filtration of the washing agent. It is not desirable that the absorbent (II) constitutes less than 0.01 wt %, since absorption of the oily soil (I) becomes difficult.

Regarding to a method of addition of absorbent (II) to perfluorocarbon liquid (III), the above-mentioned absorbents (II) can be directly mixed with the perfluorocarbon liquid (III). The absorbent can be fixed on the wall of washing tank by means of strings and acetablum to facilitate its easy absorption.

According to the washing agent composition and washing method of oily soil used in the present invention, increased temperature may improve an oil absorbing rate into the absorbents (II), when it is difficult to obtain sufficient washing effect at ambient temperature.

The oil absorbents of the present invention include activated carbon, silica, zeolite, diatomaceous, activated alumina, montmorillonite (acidic clay), acid-treated montmorillonite (activated clay), halloysite, allophane, Attapulgite kaolin talc, pectolite, saponite, Stephensite, bentonite, Sepiolite, and agalmatolite.

DETAILED DESCRIPTION OF THE PREFERRED EMBODIMENTS

Figure 1:
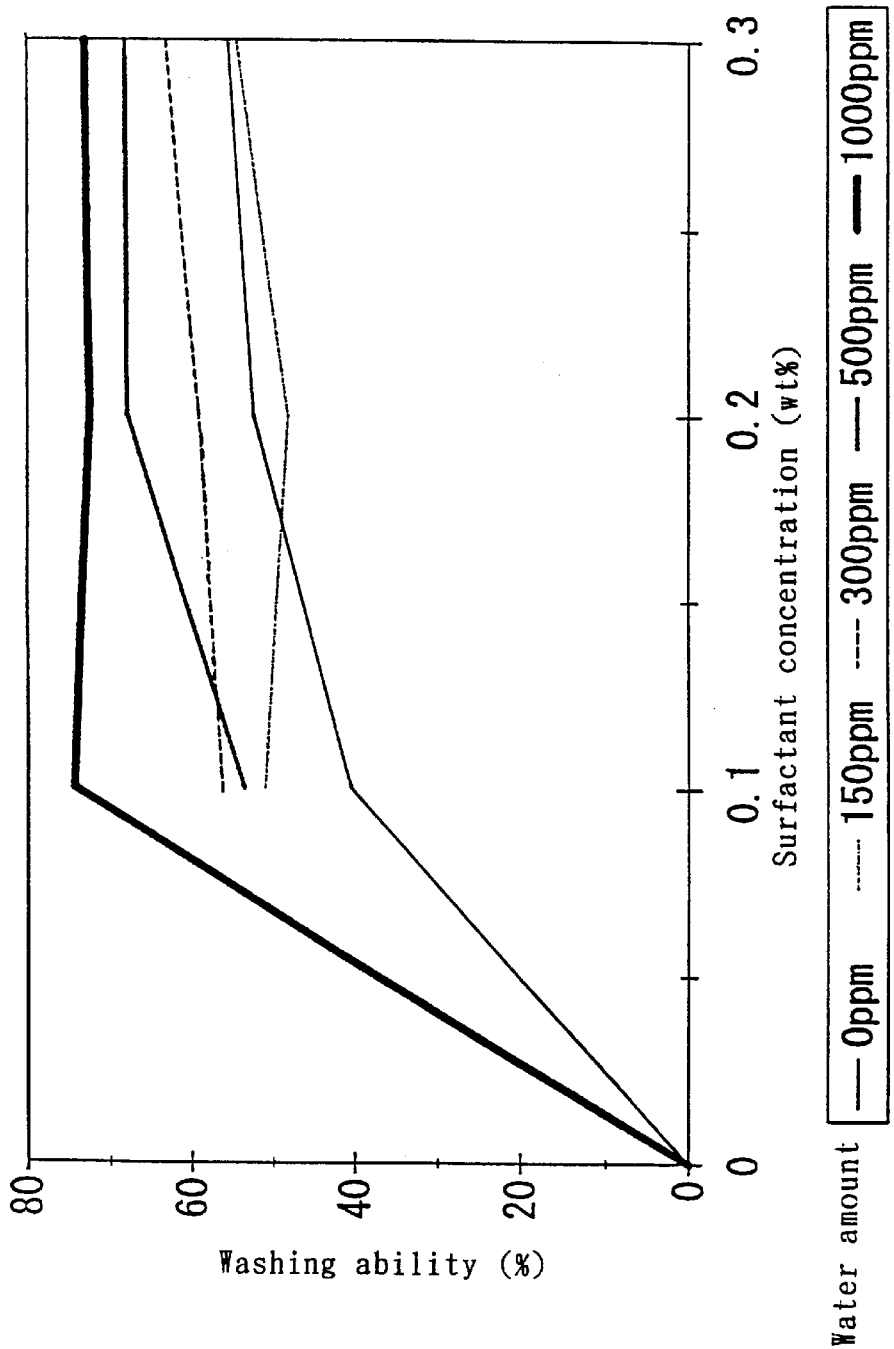
FIG. 1 shows the relation between the concentration of the surfactant and the water-soluble soil washing ability for every amount of water.

The present invention is explained in detail referring to the following examples which do not intend to limit the scope of the present invention. Part and % in the examples are based on weight unless specifically noted.

EXAMPLE 1

To a 500-ml flask equipped with a thermometer, a stirrer, a gas introducing tube and a reflux condenser, 3 parts of gelatin dissolved in 300 parts of water was placed and heated at 40° C. under nitrogen gas flow with stirring while inside the flask was substituted with nitrogen. Then, a solution containing 99.794 parts of nonylphenyl acrylate (SP value: 8.3) as the monomer (A), 0.206 part of 1,6-hexandiol diacrylate as the cross-linking monomer (B), and 0.5 part of benzoylperoxide as a polymerization initiator was added to the flask at once and vigorously agitated at 400 rpm.

The temperature in the flask was then increased to 80° C., which temperature was maintained for 2 hours to proceed polymerization reaction. After that, the temperature in the flask was increased to 90° C., which temperature was maintained for another 2 hours to complete polymerization to obtain water dispersion of oil absorbing polymer (1). The average particle size of the oil absorbing polymer (1) ranged from 100 to 1,000 μm. The content of the oil absorbing polymer (1) in the water dispersion thus obtained was 25.5%. The oil absorbing ability of the oil absorbing polymer (1) was good and evaluated as B among grades A–E, good.

EXAMPLE 2

The method identical to that used in Example 1 was repeated, but 59.815 parts of isobutyl methacrylate (SP value: 7.5) and 39.877 part of stearyl acrylate (SP value: 7.8) as the monomers (A), 0.308 part of 1,6-hexanediol acrylate as the cross-linking monomer (B) were employed instead, to produce water dispersion of oil absorbing polymer (2). The average particle size of the oil absorbing polymer (2) ranged from 100 to 1,000 μm and the content of oil absorbing polymer (2) in the water dispersion thus obtained was 25.0%. After that, the granular products were filtered off, washed with water, dried at 60° C. to obtain oil absorbing polymer (2) with a particle size ranging from 100 to 1,000 μm. The oil absorbing ability of the oil absorbing polymer (2) was evaluated as C among the grades A–E.

EXAMPLE 3

The method identical to that used in Example 1 was repeated, but 99.823 parts of dodecyl acrylate (SP value: 7.9) as the monomer (A), 0.177 part of ethyleneglycol diacrylate as the cross-linking monomer (B) were employed instead, to produce water dispersion of oil absorbing polymer (3). The average particle size of the oil absorbing polymer (3) ranged from 100 to 1,000 μm and the content of oil absorbing polymer (3) in the water dispersion thus obtained was 25.0%.

After that, to a 500-ml flask equipped with a stirrer, 15 parts of calcium stearate was added, then 325 parts of the water dispersion containing the oil absorbing polymer (3) was gradually added and stirred for 10 minutes to obtain granulates consisting of the polymer and calcium stearate. Then, the granulates were dried at 80° C. to obtain granulates of oil absorbing polymer (3) with an average particle size ranging from 100 to 1,000 μm. The content of oil absorbing polymer (3) in the granulates thus obtained was 85.0%. The oil absorbing ability of the oil absorbing polymer (3) was evaluated to the highest A grade among grades A–E.

EXAMPLE 4

The method identical to that used in Example 1 was repeated, but 49.930 parts of hexadecyl methacrylate (SP value: 7.8) and 49.930 parts of N-octyl methacrylamide (SP value: 8.6) as monomers (A), 0.140 part of divinylbenzene as the cross-linking monomer (B) were employed instead, to produce water dispersion of oil absorbing polymer (4). The average particle size of the oil absorbing polymer (4) ranged from 100 to 1,000 μm and the content of oil absorbing polymer (4) in the water dispersion thus obtained was 25.0%.

After that, to a 500-ml flask equipped with a thermometer and a stirrer, 15 parts of calcium carbonate was added, then 325 parts of the water dispersion containing the oil absorbing polymer (4) was gradually added, stirred for 10 minutes, and the temperature was then increased to 80° C. to reduce water content to obtain granulates containing the polymer and calcium carbonate. Then, the granulates were dried completely at 80° C. to obtain granulates of oil absorbing polymer (4) with an average particle size ranging from 100 to 1,000 μm. The content of oil absorbing polymer (4) in the granulates thus obtained was 85.0%. The oil absorbing ability of the oil absorbing polymer (4) was evaluated as C among grades A–E.

EXAMPLE 5

To a 500-ml flask with a baffle equipped with a thermometer, a stirrer, a gas introducing tube and a reflux condenser, 3 parts of polyoxyethylene alkylether (Nippon Shokubai: Softanole 150) dissolved in 300 parts of water was placed and heated at 40° C. under nitrogen gas flow with stirring, while inside the flask was substituted with nitrogen. Then, a solution containing 57.772 parts of dodecyl acrylate (SP value: 7.9) and 38.515 parts of N-dioctyl acrylamide (SP value: 8.2) as monomers (A), 3.713 parts of polypropyleneglycol dimethacrylate (molecular weight 4,000) as crosslinking monomer (B), and 0.5 part of benzoylperoxide as a polymerization initiator was added to the flask at once and vigorously agitated at 750 rpm.

The temperature in the flask was then increased to 80° C., which temperature was maintained for 2 hours to proceed polymerization reaction. After that, the temperature in the flask was increased to 90° C., which temperature was maintained for another 2 hours to complete polymerization to obtain water dispersion containing polymer with an average particle size of 30 μm (pure resin content 25 wt %).

To a water solution prepared by dissolving 1.5 parts of above-mentioned polyoxyethylene alkylether in 150 parts of water, one part of fine granules (average particle size 4 μm) of hydrophobic silica (Nippon Silica, Nipseal SS-70, methanol value 65) and 4 parts of fine granules (average particle size 5 μm) of aluminium monostearate were added and stirred at 300 rpm to obtain water dispersion of hydrophobic silica and aluminium stearate. Then, 60 parts of the water dispersion containing oil absorbing polymer (5) was gradually added and stirred for further 10 minutes to obtain agglomerate comprising hydrophobic silica and aluminium stearate. After that, the agglomerate was filtered off, dried at 80° C., and crushed to obtain granulated products of oil absorbing polymer (5) with an average particle size of 2 mm. The composition of the granulates thus obtained was as follows: 15 parts of oil absorbing polymer (5), 1 part of hydrophobic silica, and 4 parts of aluminium monostearate. The oil absorbing ability of the oil absorbing polymer (5) was evaluated as C.

EXAMPLE 6

The method identical to that employed in Example 5 was repeated, but 99.796 parts of 2-ethylhexyl acrylate (SP value: 8.4) as the monomer (A) and 0.363 part of 1,9-nonandiol diacrylate as the cross-linking monomer (B) were employed instead, to obtain oil absorbing polymer (6) with an average particle size of 2 mm. The composition of the granulates thus obtained was as follows: 15 parts of oil absorbing polymer (6), 1 part of hydrophobic silica, and 4 parts of aluminium monostearate. The oil absorbing ability of the oil absorbing polymer (6) was evaluated as the highest grade A.

EXAMPLE 7

The method identical to that employed in Example 5 was repeated, but 99.771 parts of cyclohexyl methacrylate (SP value: 8.3) as the monomer (A) and 0.229 part of N,N'-methylene bisacrylamide as the cross-linking monomer (B) were employed instead, and 5 parts of hydrophobic silica was used in place of 1 part of hydrophobic silica and 4 parts of aluminium monostearate, to obtain oil absorbing polymer (7) with an average particle size of 2 mm. The composition of the granulate was as follows: 15 parts of oil absorbing polymer (7) and 5 parts of hydrophobic silica. The oil absorbing ability of the oil absorbing polymer (7) was evaluated as grade C.

EXAMPLE 8

The method identical to that employed in Example 5 was repeated, but 99.855 parts of stearyl acrylate as the monomer (A) and 0.145 part of 1,4-butandiol diacrylate as the cross-linking monomer (B) were employed instead, and 5 parts of alminium monostearate was used in place of 1 part of hydrophobic silica and 4 parts of alminium monostearate, to obtain oil absorbing polymer (8) with an average particle size of 2 mm. The composition of the granules thus obtained was as follows: 15 parts of oil absorbing polymer (8) and 5 parts of aluminium monostearate. The oil absorbing ability of the oil absorbing polymer (8) was evaluated as the highest grade A.

EXAMPLE 9

To a pouring type glass mold for polymerization (a tray of 5×5×1 cm) equipped with a thermometer and a gas introducing tube, a solution containing 99.811 parts of vinyl laurate (SP value: 7.9) as the monomer (A), 0.187 part of trimethylolpropane triacrylate as the cross-linking monomer (B), and 0.1 part of 2,2'-azobisdimethylvaleronitrile as a polymerization initiator was poured. The mixture was heated at 60° C. under nitrogen gas flow for 2 hours to proceed polymerization reaction. Then, temperature was increased to 80° C., which temperature was maintained for 2 hours to complete polymerization. After standing for cooling, the gel substance was removed from the mold and crushed at a temperature below a glass-transition temperature to obtain granules of oil absorbing polymer (9) with an average particle size of 1 mm. The oil absorbing ability of the oil absorbing polymer (9) was evaluated as the highest grade A.

EXAMPLE 10

The procedure employed in Example 9 was repeated, except that 99.796 parts of isobornyl acrylate (SP value: 8.4) as a monomer (A) and 0.204 part of ethyleneglycol diacrylate as the cross-linking monomer (B) were employed instead, to obtain oil absorbing polymer (10) with an average particle size of 1 mm. The oil absorbing ability of the oil absorbing polymer (10) was good and evaluated as grade B.

EXAMPLE 11

The procedure employed in Example 9 was repeated, except that 54.881 parts of t-butylstyrene (SP value 7.9) and 44.903 parts of 1-decene (Sp value: 7.0) as monomers (A) and 0.216 part of divinylbenzene as the cross-linking monomer (B) were employed instead, to obtain oil absorbing polymer (11) with an average particle size of 1 mm. The oil absorbing ability of the oil absorbing polymer (11) was evaluated as grade C.

EXAMPLE 12

The procedure employed in Example 9 was repeated, except that 74.793 parts of nonylphenyl acrylate (SP value: 8.3) and 24.931 parts of hydroxyethyl acrylate (SP value: 10.3) as monomers (A) and 0.276 part of 1,6-hexanediol diacrylate as the cross-linking monomer (B) were employed instead, to obtain oil absorbing polymer (12) with an average particle size of 1 mm. The oil absorbing ability of the oil absorbing polymer (12) was evaluated as grade C.

EXAMPLE 13

The procedure employed in Example 9 was repeated, except that 59.327 parts of t-butyl acrylate (SP value: 8.7) and 39.552 parts of styrene as monomers (A) and 1.121 part of polyethyleneglycol diacrylate (molecular weight 500) as the cross-linking monomer (B) were employed instead, to obtain oil absorbing polymer (13) with an average particle size of 1 mm. The oil absorbing ability of the oil absorbing polymer (13) was evaluated as grade C.

Comparative Example 1

The procedure employed in Example 1 was repeated, except that the amount of nonylphenyl acrylate as the monomer (A) was changed to 94.541 parts and that of 1,6-hexanediol diacrylate as the cross-linking monomer (B) was changed to 5.459 parts to produce water dispersion of the oil absorbing polymer (15). The average particle size of the oil absorbing polymer (15) ranged from 100 to 1,000 μm and the content of the oil absorbing polymer (15) in the water dispersion thus obtained was 25.4%. In this comparative example, the amount of the cross-linking monomer (B) exceeded 4 wt %. Thus, the resin was highly cross-linked and the resin could not be swollen sufficiently. The oil absorbing ability of the oil absorbing polymer (15) was scarcely observed.

Comparative Example 2

The procedure employed in Example 1 was repeated, except that 39.713 parts of nonylphenyl acrylate and 59.570 part of acrylonitrile (SP value: 9.2) as the monomer (A) were employed instead of 99.794 parts of nonylphenyl acrylate and the amount of 1,6-hexanediol diacrylate as the cross-linking monomer (B) was changed to 0.717 parts to produce water dispersion of oil absorbing polymer (16). The average particle size of the oil absorbing polymer (16) ranged from 100 to 1,000 μm and the content of the oil absorbing polymer (16) in the water dispersion thus obtained was 25.5%. In this comparative example, the content of the monomer with SP value not higher than 9 in the monomers (A) was lower than 50%, resulting in inferior oil absorbing ability.

Comparative Example 3

The procedure employed in Example 1 was repeated, except that the amount of nonylphenyl acrylate as the monomer (A) was changed to 100 parts and 1,6-hexanediol diacrylate as the cross-linking monomer (B) was not employed to produce water dispersion of oil absorbing polymer (17). The average particle size of the oil absorbing polymer (17) ranged from 100 to 1,000 μm and the content of the oil absorbing polymer (17) in the water dispersion thus obtained was 25.0%. In this comparative example, since the cross-linking monomer (B) was not incorporated, the highest oil absorbing ability was obtained. However, it had disadvantages such as reduced strength of the resin due to lack of cross-linkage and increased content of soluble components.

Comparative Example 4

The procedure employed in Example 6 was repeated, except that the amount of 2-ethylhexyl acrylate as the monomer (A) was changed to 94.650 parts and 5.345 parts of divinyl benzene was used in place of 0.145 part of 1,9-nonandiol diacrylate as the cross-linking monomer (B) to obtain granulated products of oil absorbing polymer (18) with an average particle size of 2 mm. The granulated substance thus obtained had a composition comprising 15 parts of oil absorbing polymer (18), 1 part of hydrophobic silica, and 4 parts of alminium monostearate. In this comparative example, since the amount of the cross-linking monomer (B) exceeded 4 wt %, the resin was too highly cross-linked to be swollen. Thus, it scarcely exhibited oil absorbing ability.

Comparative Example 5

The procedure employed in Example 6 was repeated, except that 39.905 parts of 2-ethylhexyl acrylate and 59.857 parts of hydroxyethyl acrylate (SP value: 10.3) were employed in place of 99.85 parts of 2-ethylhexyl acrylate as the monomer (A) and 0.238 part of divinyl benzene was used in place of 0.145 part of 1,9-nonandiol diacrylate as the cross-linking monomer (B) to obtain granulated products of oil absorbing polymer (19) with an average particle size of 2 mm. The granulated substance thus obtained had a composition comprising 15 parts of oil absorbing polymer (19), 1 part of hydrophobic silica, and 4 parts of alminium monostearate. In this comparative example, since the content of the monomer with a SP value not higher than 9 in the monomer (A) was less than 50%, its oil absorbing ability was significantly inferior. Thus, it scarcely exhibited oil absorbing ability.

Comparative Example 6

The procedure employed in Example 1 was repeated, except that the amount of 2-ethylhexyl acrylate as the monomer (A) was changed to 100 parts and 1,9-nonandiol diacrylate as the cross-linking monomer (B) was not employed to produce water dispersion of oil absorbing polymer (20) with an average particle size of 2 mm. The composition of the granulated substance thus obtained was as follows: 15 parts of oil absorbing polymer (20), 1 part of hydrophobic silica, and 4 parts of alminium monostearate. In this comparative example, since the cross-linking monomer (B) was not incorporated, the highest oil absorbing ability was obtained. However, it had disadvantages such as reduced strength of the resin due to lack of cross-linkage and increased content of soluble components.

(Experiment 3) Removal of Water-soluble Soil

A hundred ml of washing agent comprising perfluoro-N-methylmorpholine ($C_4F_8ONCF_3$) and 0.1–0.5 wt % of a surfactant (Sumitomo 3M: PF-5052DS) was used. To a piece of polyester cloth (5×5 cm; about 0.16 g) stained with edible pigment violet No. 1 (0.1 w/v %) and carboxymethyl cellulose (1.5 w/v %) as a cloth stained with water-soluble soil and a piece of cloth made of 65% of polyester and 35% of cotton (5×5 cm: about 0.30 g) as a restrained cloth, required pieces of white woolen cloth (5×5 cm: about 0.25 g) were added to make a total cloth weight to 5±0.05 g. To a 300-ml conical flask, the washing agent and the cloths were placed. The concentration of the surfactants and the amount of water were changed. The cloth was washed in the shaker at 20° C. for 30 minutes.

Figure 2:
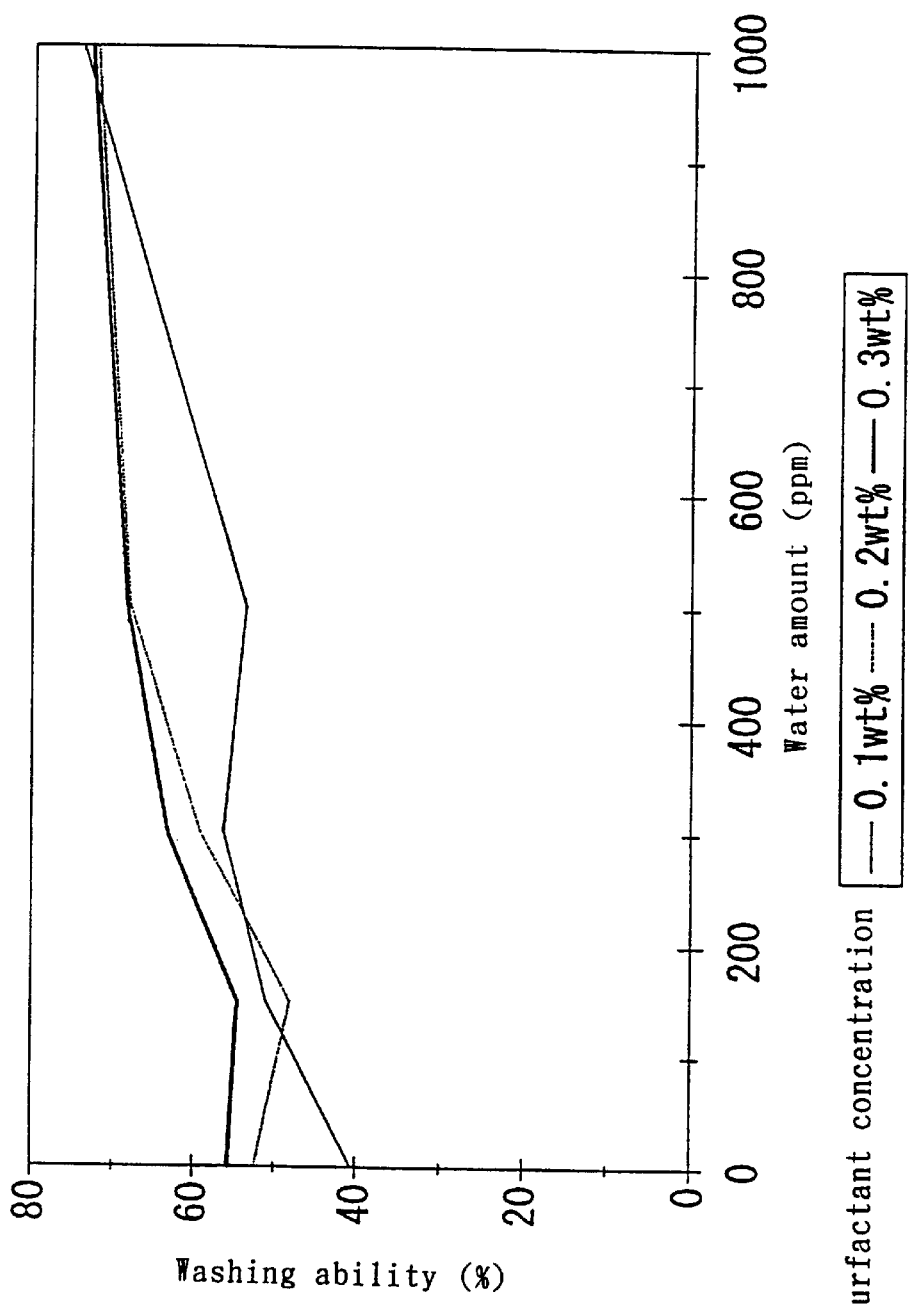
FIG. 2 shows the relation between the amount of water and the water-soluble soil washing ability for every concentration of the surfactant.

The results of Experiment 3 are shown in FIG. 1, in which the relation between the surfactant concentration and the water-soluble soil washing ability is shown for every water amount. FIG. 2 shows the relation between the amount of water and the water-soluble soil washing ability for every surfactant concentration. FIGS. 1 and 2 show that although water-soluble soil could not be removed by addition of water unless surfactant is added, it could be removed by addition of surfactant even without addition of water. Although FIG. 1 indicates that no significant increase in washing ability was achieved by increase in surfactant concentration, it is expected that washing ability is elevated by increased amount of water according to FIG. 2. Excessive amount of surfactants are not desirable since they may damage the washing such as causing unevenness.

Figure 3:
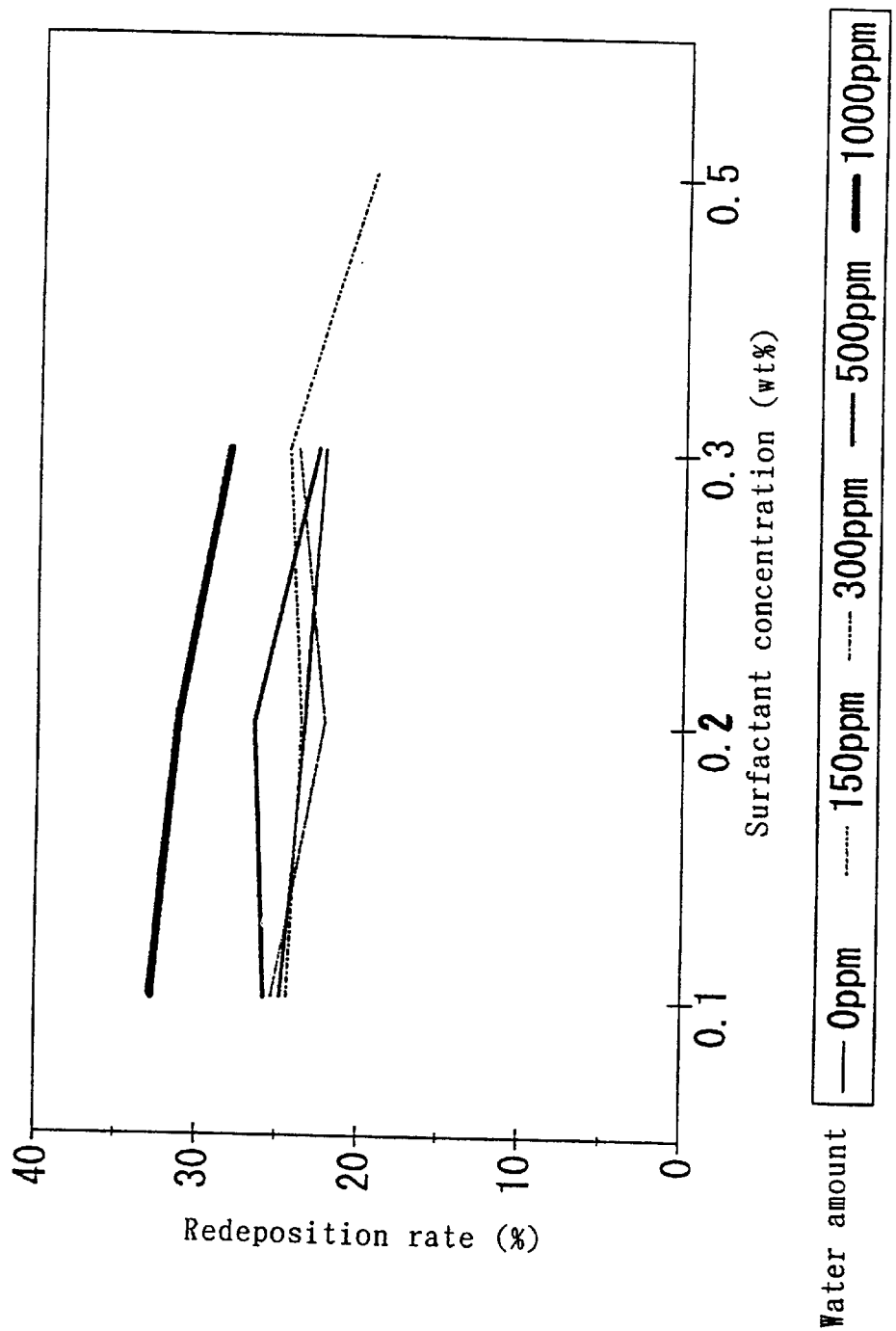
FIG. 3 shows the relation between the concentration of surfactant and the soil redeposition for every amount of water.
Figure 4:
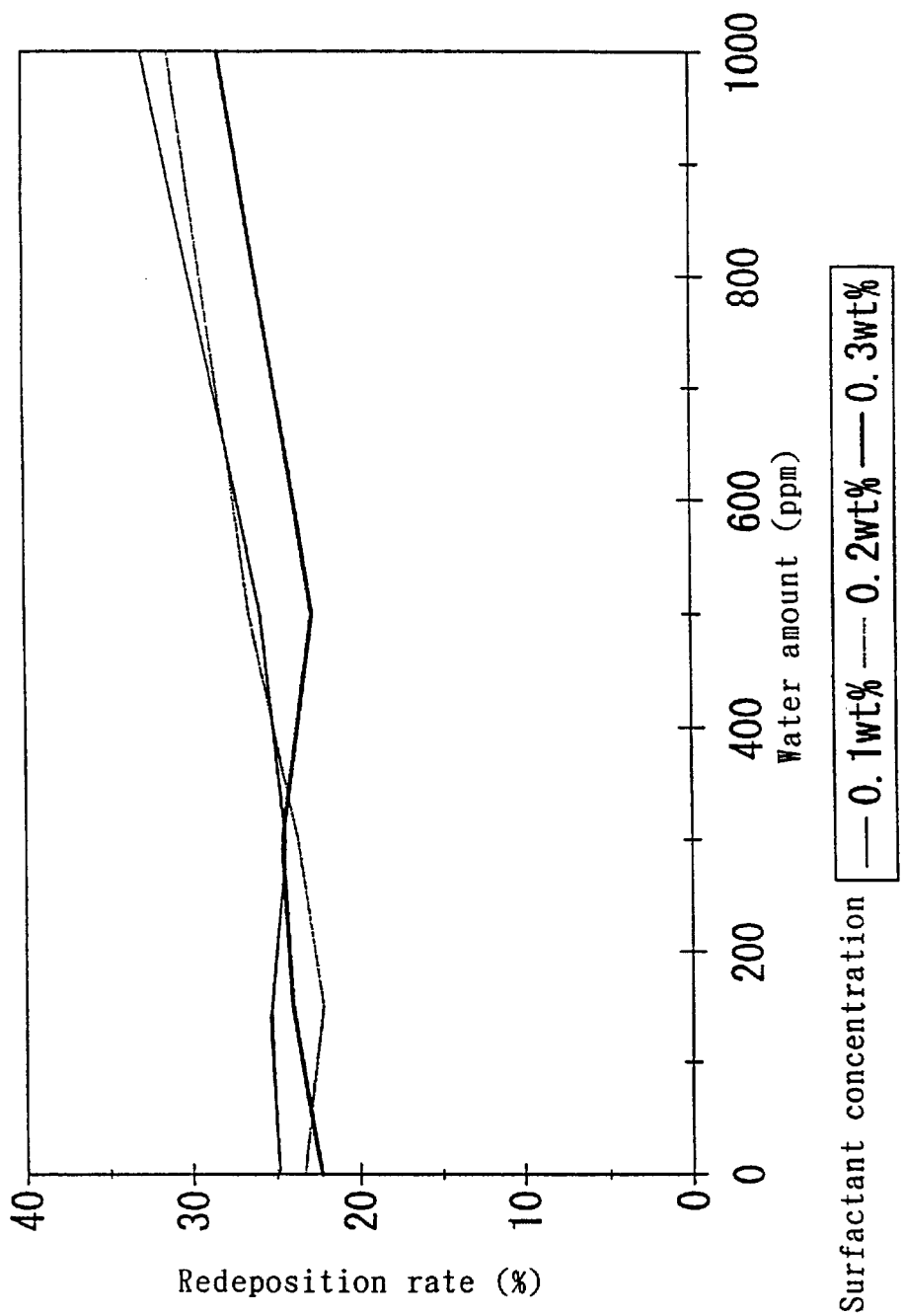
FIG. 4 shows the relation between the amount of water and the soil redeposition according to surfactants.

FIG. 3 shows the relation between the soil redeposition rate of cloth made of 65% polyester and 35% of cotton and the surfactant concentration for every amount of water. FIG. 4 represents the relation between the soil redeposition rate and the amount of water for every surfactant concentration. The soil redeposition rate exceeding 20% was observed in all cases. No soil redeposition was observed for the white woolen cloth. It is considered that since the cloth made of blended material is highly hydrophilic, water moves toward fibers until the equilibrium between the fibers and humidity of the washing agent is attained, when the washing agent contains water (moisture) in a greater amount than that contained in the fibers during a washing process. At that time, water-soluble soil (edible pigment, in this case), which had been dissolved and removed from the fibers, is solubilized and present in water, which moves toward the fibers together with water to cause soil redeposition.

Therefore, in order to prevent soil redeposition, it is better to begin washing after a relative humidity of fibers to be washed and that of the washing agent become identical.

In addition, use of strong water-absorbents can improve washing ability and prevent soil redeposition. If strong water-absorbents which had absorbed water in advance are placed in the washing agents, a constant water content can be maintained in the washing agents. It is effective for improvement of washing ability and prevention of soil redeposition. A polymer absorbent (Acrylic CA: Nippon Shokubai) can be mentioned as a strong water-absorbent.

(Experiment 4) Removal of Oily Soil

To 100 ml of liquid containing perfluorohexan and perchloroethylene, 2-ethylhexyl acrylate as the monomer (A) and oilabsorbent PW as the cross-linking monomer (B) were added to form a washing agent. The washing agent, and a piece of cloth with oily soil (5×5 cm: about 0.16 g), which had been soaked in a solution containing 5 g of tallow, 15 g of liquid paraffin, and 0.1 g of oil red in 500 ml of carbon tetrachloride, dried spontaneously, and conditioned under 65 RH % at 20° C. and required pieces of white woolen cloths (JIS attaching white cloth 5×5 cm: about 0.25 g) to make a total weight of cloth 5±0.05 g were placed in a conical 300 ml flask. The amounts of perchloroethylene and oil-absorbent were changed. Washing was performed in a shaker at 20° C. for 30 minutes.

Figure 5:
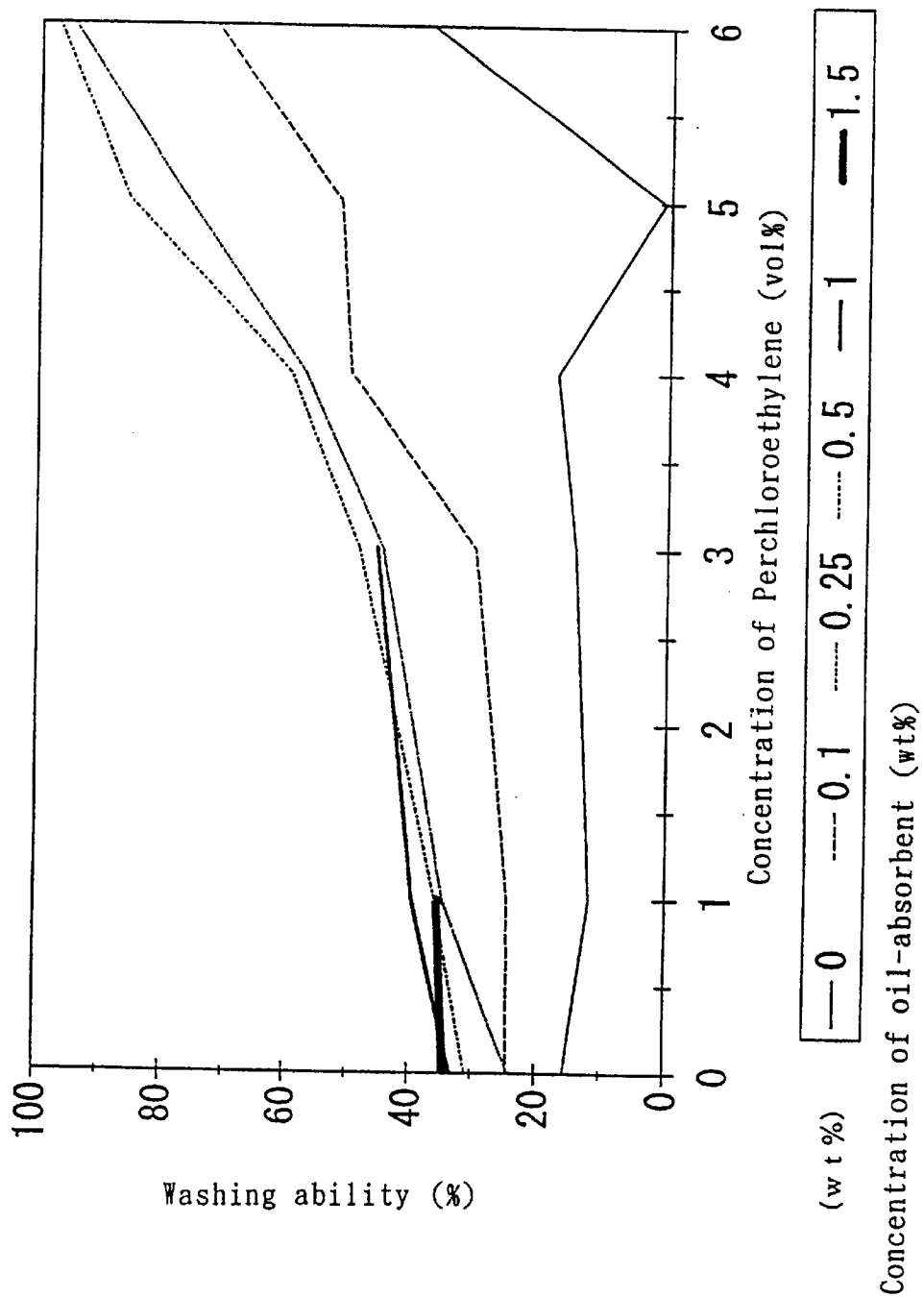
FIG. 5 shown the relation between the concentration of perchloroethylene and the oily soil washing ability for every concentration of oleosorb.
Figure 6:
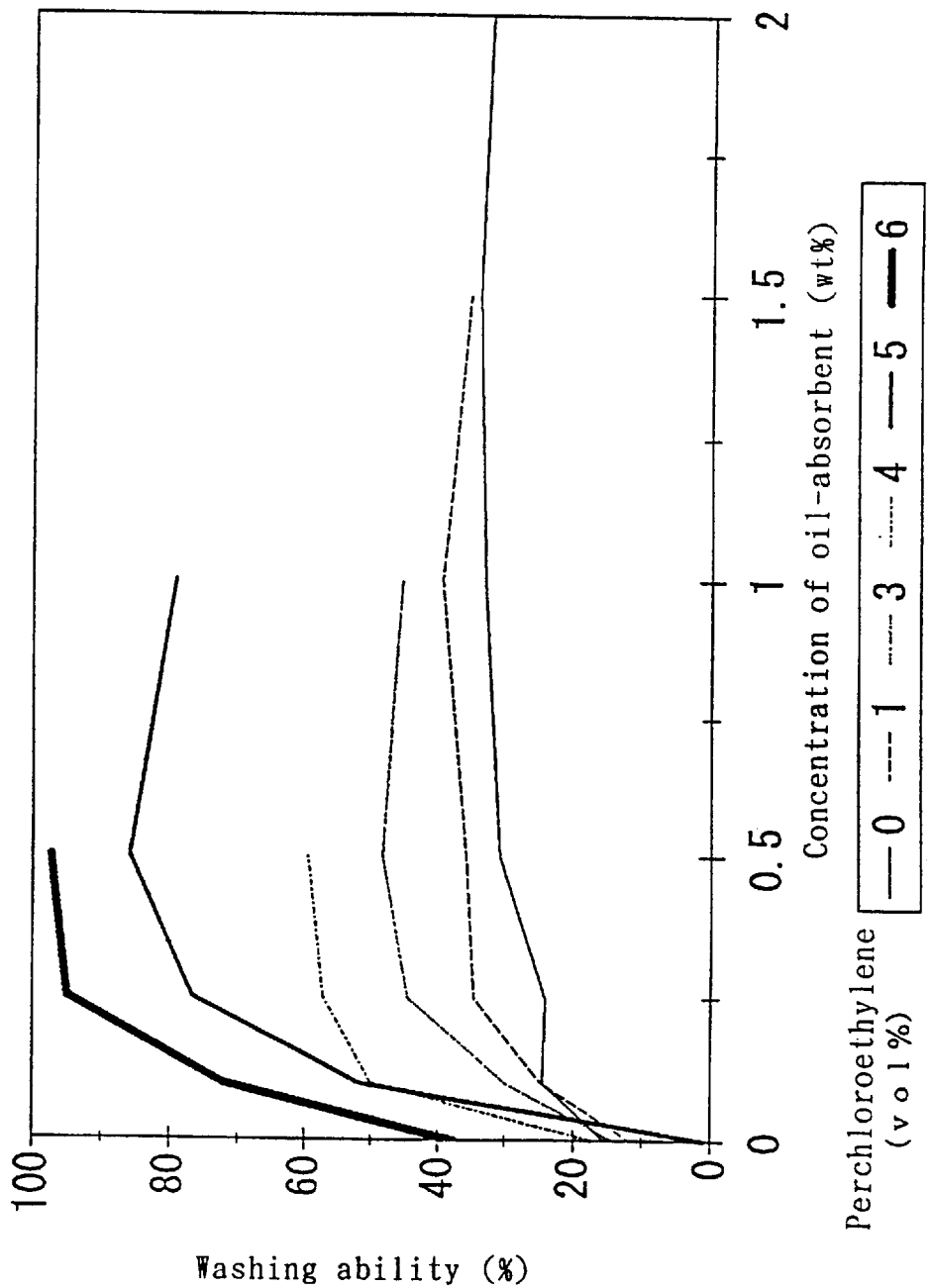
FIG. 6 shows the relation between the concentration of oleosorb and the oily soil washing ability for every perchloroethylene concentration.

The results of Experiment 4 are shown in FIG. 5, which represents the relation between the perchloroethylene concentration and the oily soil washing ability for every concentration of oil-absorbent PW. FIG. 6 shows the relation between the concentration of oil-absorbent PW and the oily soil washing ability for every concentration of perchloroethylene.

FIGS. 5 and 6 indicate contribution of oil-absorbent to improvement of oily soil washing ability.

Figure 7:
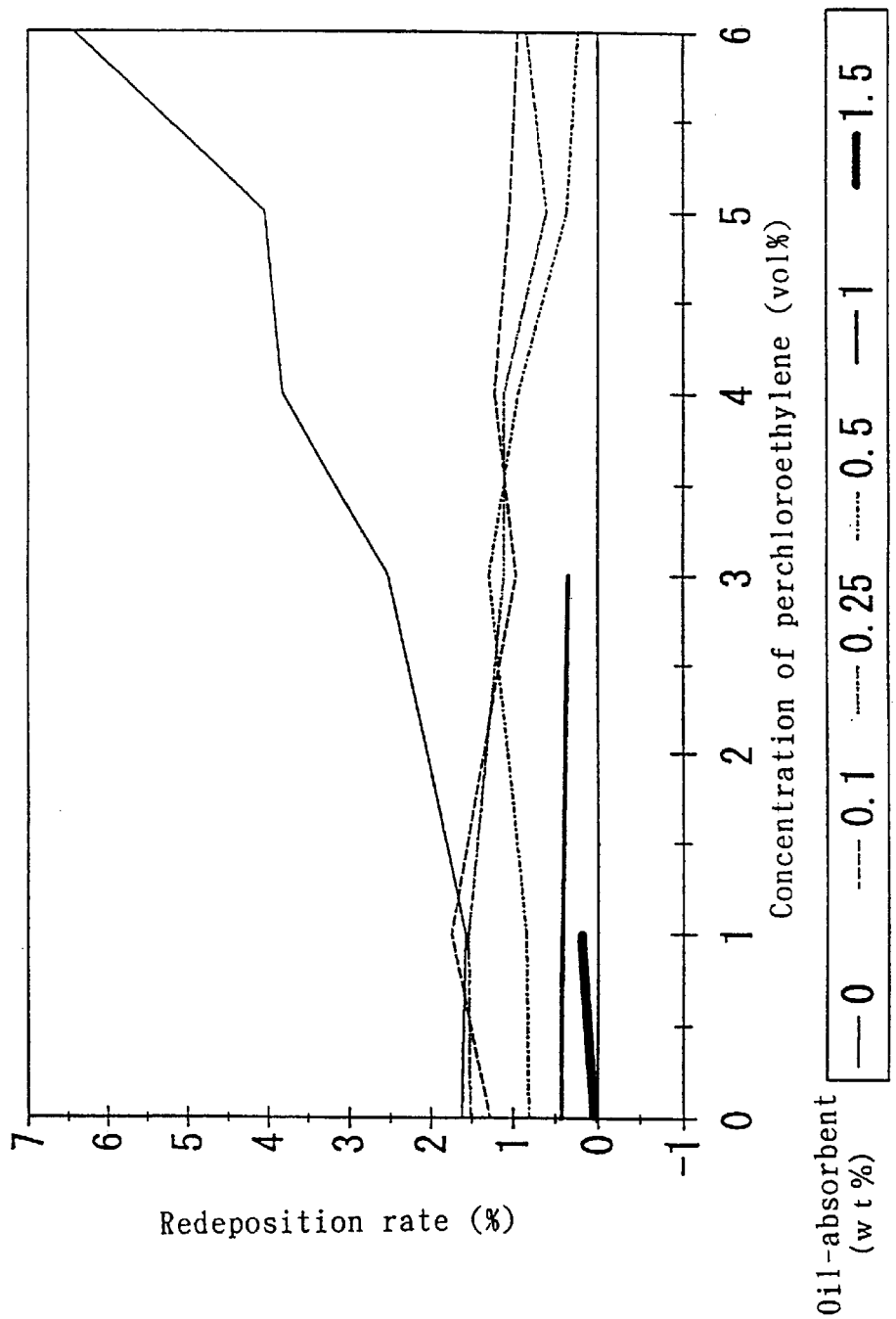
FIG. 7 shows the relation between the concentration of perchloroethylene and the soil redeposition to the white woolen cloth for every concentration of Oleosorb.
Figure 8:
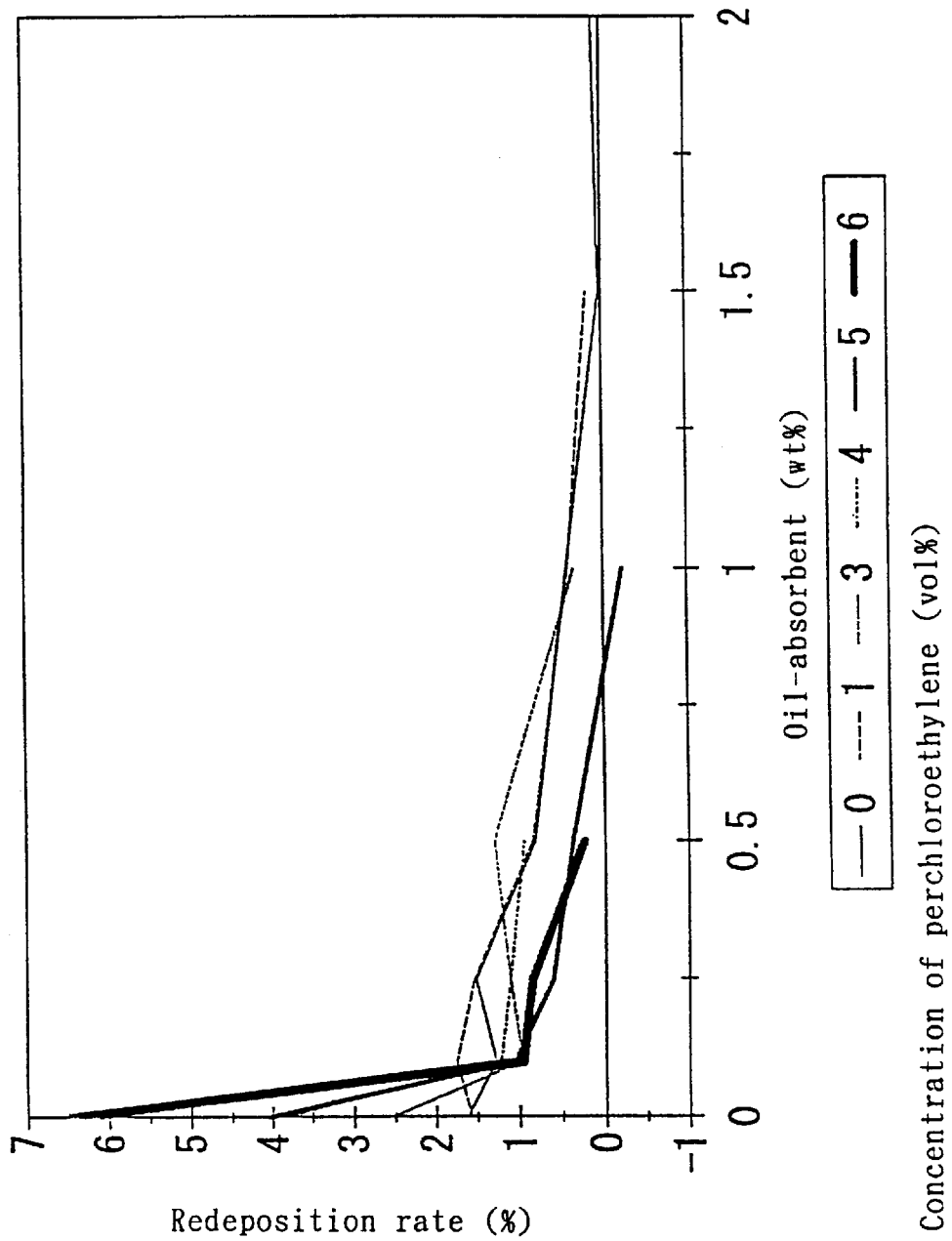
FIG. 8 shows the relation between the concentration of oleosorb and the retaining of white woolen cloth for every concentration of perchloroethylene.

FIG. 7 shows the relation of the concentration of perchloroethylene and the soil redeposition on the white woolen for every concentration of oil-absorbent PW, and FIG. 8 shows the relation between the concentration of oil-absorbent PW and soil redeposition to the white wool for every concentration of perchloroethylene. These figures show that soil redeposition occurs significantly unless oil-absorbent PW is added. This phenomena occurred because oily stain once removed is immediately reattached to the washing, since oily soil dissolved in perchloroethylene is more stable in washing of white wool than in perfluorohexane. The redeposition can be prevented by addition of oil-absorbent PW, since oil-absorbent PW has stronger affinity to oily soil dissolved in perchloroethylene than the washing and it has about 20 some-times higher perchloroethylene-absorption capability.

The results indicate that the addition of a small amount of oil-absorbent PW to perfluorohexan is effective for improvement of oily soil washing ability and prevention of soil redeposition. When is added at 0.15 wt % or higher, washing ability and soil redeposition reach the equilibrium. However, it is desirable to add a higher amount of oil-absorbent PW to absorb oily soil continuously.

Activated carbon, silica, diatomaceous, and other oil adsorbents can be employed instead of oil-absorbent PW to achieve similar prevention effects against soil redeposition of oily soil.

Figure 9:
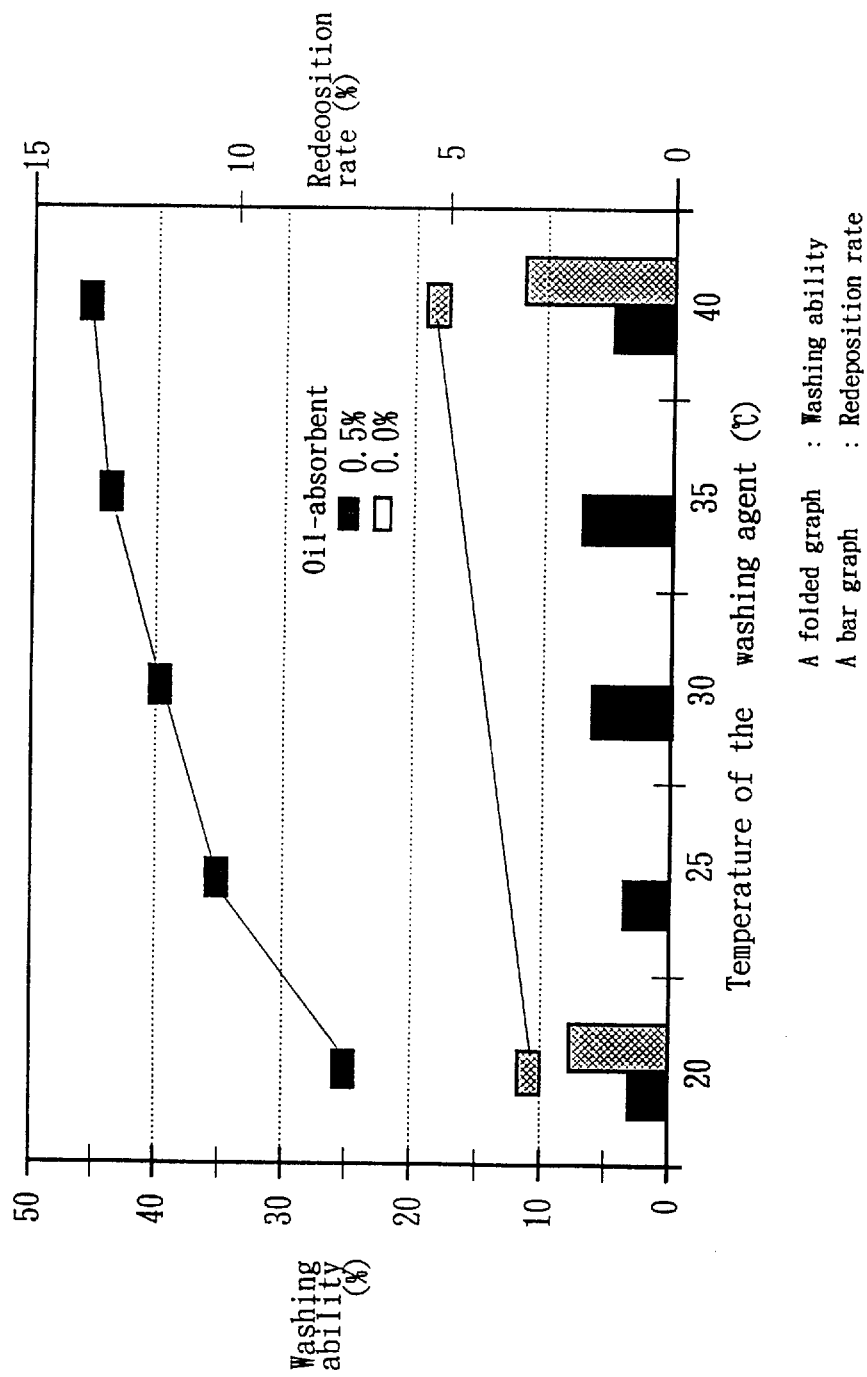
FIG. 9 shows the relation between the temperature of the washing agent and the washing ability in the presence and absence of oleosorb addition.

Washing ability was determined after the temperature of the washing agent was increased. As a result, temperature rise was advantageous for the improvement of washing ability as shown in FIG. 9.

Figure 10:
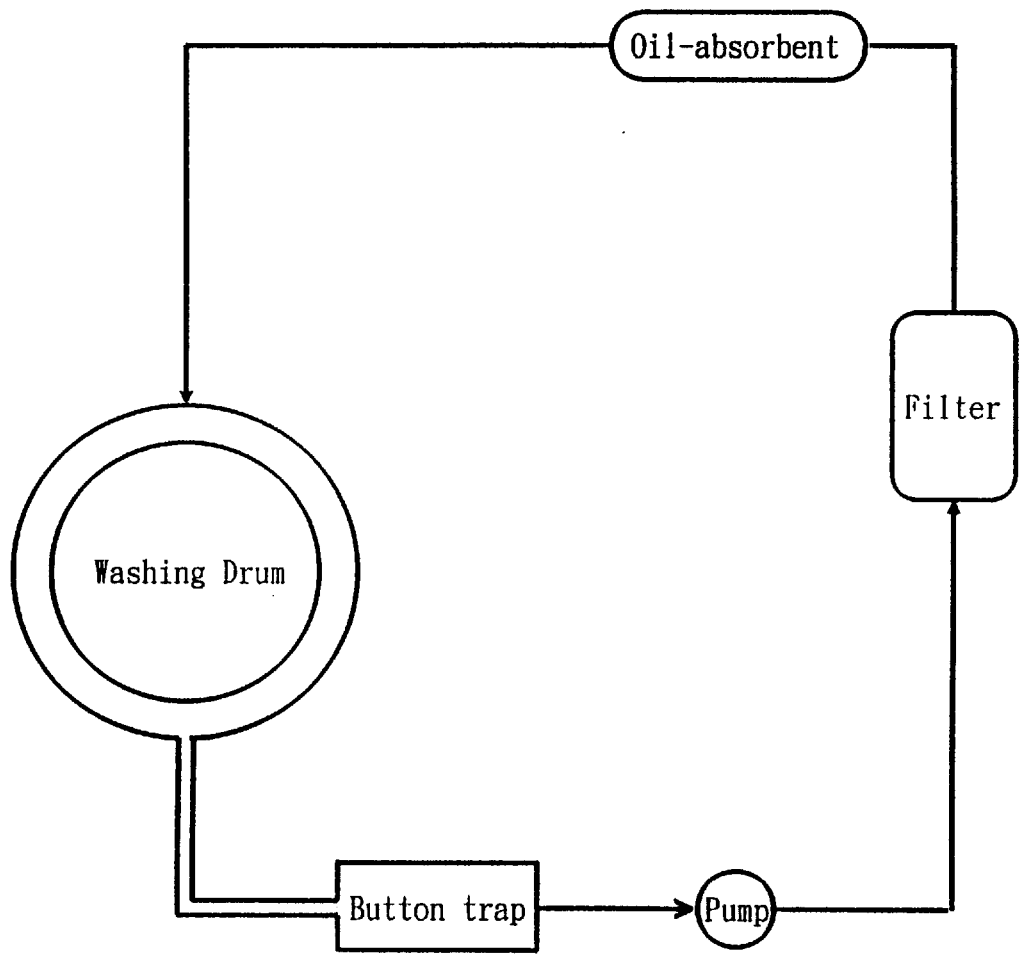
FIG. 10 shows a filtration process of the washing agent.

Although the oil absorbent was added directly to perflouorohexane in Experiment 4, oil absorbent held in non-woven fabrics and other fabrics can be added. When an oil absorbing process is set during a circulatory filtration process, oil absorbents are preferably located after the pump or filter or in the filter (FIG. 10).

Preferred embodiments of the present invention are described below:

(1) A washing agent composition comprising 99.99–50 parts of perfluorocarbon liquid, 30–0.01 part of absorbents, and 20–0 part of organic solvents such as perchloroethylene;

(2) A washing agent composition comprising 99.999–94 parts of perfluorocarbon liquid, 5–0.001 part of surfactants, and 1–0 part of water;

(3) A washing agent composition obtained by mixing of above-mentioned 1 and 2; and (4) A washing method characterized in that the washing agent composition according to any one of 1, 2 and 3 mentioned above was placed in a treatment tank to wash garments and 100–4 parts of absorbents and 96–0 part of perchloroethylene were placed together in a filter or separate container set between a circulatory process of the washing agents from the treatment tank to wash the washing agent through the circulatory filtration process.

According to the present invention, washing can be performed without using specified Freons which are ozone destruction substances, and petroleum solvents which are strongly inflammable so that it is thus difficult to be used in city areas, without damaging garments by petroleum solvents during a drying process, or without causing corrosion of some resins unlike HCFC-225, HCFC-141b, etc. Damage of garments through dissolution can be also avoided, since the KB value is 0. Handling is easy, since the solvents are inactive. The present invention also eliminates risk of soil redeposition to the washing by addition of absorbents.

According to the washing method using the novel liquid of the present invention, soil which could not be removed by laundry and dry-cleaning can be removed without giving chemical damage. The liquid of the present invention is not ozone destruction agents as CFC-113. The liquid has no risk of inflammability and no toxicity. Since the boiling point of perfluorohexane is close to that of CFC-113, washing machines for CFC-113 can be continuously employed if perfluorohexane is employed as the perfluorocarbon liquid. In addition, since perfluorocarbons with a larger number of carbon atoms such as perfluoroheptan and perfluorooctane also have properties similar to CFC-113 except for the difference in the boiling point, the same machine may be employed with a minor reform.

It can be said that the newly found liquid has much lower heat of vaporization, even lower than CFC-113 which has relatively lower heat of vaporization among solvents presently used for dry-cleaning, thus they are easily dried and give smaller mechanical damages to the washing. When organic solvents used are recovered and reused for reasons of toxicity and cost like solvents for dry-cleaning, forced drying with a tumble drier using hot wind was employed. In this case, if petroleum solvents (such as n-decane) with a high boiling point and a high heat of vaporization are employed, it takes time for the solvents to be dried and thus the washing tends to be given mechanical (physical) damage. This can also be said for laundry. That is to say, various damages are caused by forced drying in laundry due to a high heat of vaporization of water.

This washing process using the perfluorocarbon liquid can prevent chemical influences of water and organic solvents and reduce significantly mechanical damages caused by forced drying in laundry and dry-cleaning in the drying process due to easiness of drying. The liquid has a significantly smaller surface tension than other liquids. Therefore, it can penetrate easily into deep regions of fibers without swelling the fibers and thus enables washing in a short time, resulting in reduction of mechanical damages during washing process.

In addition, since the liquid is easily dried due to its small heat of vaporization, energy required for drying is small, leading to energy cost reduction.

TABLE 1

Various values required to be considered for solbents

| (Unit) | CFC-113 | Petroleum n-decan | Perchloroethylen | Water | Remarks |
|---|---|---|---|---|---|
| Molecular formula | $C_2Cl_3F_3$ | $C_{10}H_{22}$ | $C_2Cl_4$ | $H_2O$ | |
| Molecular weight | 187.5 | 142 | 166 | 18 | |
| Boiling point (°C.) | 47.6 | 174.1 | 121 | 100 | Easiness of drying |
| Combution quality | Non | 46° C. | Non | Non | Dangerous |
| Pour point (°C.) | −35 | −30 | | 0 | Readiness in use |
| Specific gravity | 1.57 25° C. | 0.73 20° C. | 1.62 25° C. | 1.0 4° C. | Mechanical power |
| Kinematic viscosity (cSt) | 0.66 | 1.27 | | 0.0089 | Readiness in use |
| Vapor point (mmHg) | 331 25° C. | 10 57.7° C. | 16 20° C. | 23.76 25° C. | Easiness of drying |
| Specific point (cal/g) | 0.218 25° C. | 0.367 0° C. | 0.205 20° C. | 1.0 15° C. | Easiness of drying Solubility |
| Heat of vaporization (Cal/g) | 35.1 | 86.3 | 50.1 | 539.8 | Easiness of drying Solubility |
| Heat conductivity (cal/m · h) | 57.6 25° C. | 119 27° C. | 109 20° C. | 482.5 25° C. | Easiness of drying |
| surface tension (dyne/cm) | 17.3 | 23.9 | 32 | 72 | Permeability |
| Dissolved moisture (ppm) | 130 | 70 | 80 | | Solubility |
| KB value (ml) | 31 | 25 | 90 | 0 | Solubility |
| Green house effect constant (CFC-11 = 1) | 1.35 | | | 0 | Dangerous |
| Ozone destruction constant constant (CFC-11 = 1) | 0.85 | 0 | 0 | 0 | Dangerou |
| Solubility parameter $(cal/cm^3)^{1/2}$ | 7.2 | 7.7 | 9.0 | 23.2 | Solubility |
| Toxicity (ppm) | 1,000 | 100 | 50 | 0 | Dangerous |
| Price (Y/Kg) | 600 | 95~100 | 160 | 0.5 | Readiness in use |
| Stability | High | High | Medium | High | Readiness in usu |
| Corrosion behavior | Low | Low | Medium | Medium | Readiness in use |

TABLE 2

Physical properties of carbon fluoride liquids

| | FC-51-14 | CFC-113 | HFC43-10 | HCFC-225ca | HCFC-141b |
|---|---|---|---|---|---|
| Molecular formula | $C_6F_{14}$ | $C_2Cl_3F_3$ | $C_5H_2F_{10}$ | $C_3HCl_2$ | $F_5C_2H_3Cl_2F$ |
| Molecular weight | 338 | 187.5 | 252 | 203 | 117 |
| Boiling point (°C.) | 56 | 47.6 | 53.6 | 51.5 | 32 |
| Combution quality | Non | Non | Non | Non | Combustibility |
| Pour point (°C.) | −90 | −35 | −80 | −94 | −103.5 |
| Specific gravity | 1.68 | 1.57 | 1.58 | 1.55 | 1.25 |
| Kinematic viscosity (cSt) | 0.4 | 0.66 | 0.67 | 0.37 | 0.34 |
| Vapor point (mmHg) | 232 | 331 | 330 | | |
| Specific point (cal/g) | 0.25 | 0.218 | | 0.246 | |
| Heat of vaporization (Cal/g) | 21 | 35.1 | 24.2 | 40.14 | 53 |
| Heat conductivity (cal/m · h) | 50.4 | 57.6 | | 46.8 | 68.4 |
| surface tension (dyne/cm) | 12 | 17.3 | 14.1 | 15.8 | |
| Dissolved moisture (ppm) | 10 | 130 | 490 | | 420 |
| KB value (ml) | 0 | 31 | 5 | 34 | 58 |
| Green house effect constant (CFC-11 = 1) | | 1.35 | 0.31 | 0.025 | 0.085 |
| Ozone destruction constant constant (CFC-11 = 1) | 0 | 0.85 | 0 | 0.04 | 0.1 |
| Solubility parameter $(cal/cm^3)^{1/2}$ | 5.9 | 7.2 | 6.2 | 7.9 | 7.6 |
| Toxicity (ppm) | 0 | 1,000 | 400 | Unknown | Unknown |
| Stability | High | High | High | High | High |
| Corrosion behavior | Low | Low | Low | Low | Low |

TABLE 3

Washing rates and soil redeposition rates

| | Washing rate (%) | | | Soil redeposition rate (%) | | |
|---|---|---|---|---|---|---|
| | Water soluble | Insoluble | Oil-soluble | | | |
| Solvents | soil | soil | soil | Wool | T/C | Cotton |
| $C_4F_8ONCF_3$-a | 16.08 | 55.04 | 4.41 | 1.67 | 1.34 | 1.02 |
| $C_4F_8ONCF_3$-b | 17.86 | 52.23 | 39.05 | 1.25 | 1.90 | 2.55 |
| $C_4F_8ONCF_3$-c | 71.50 | 46.12 | 76.25 | 1.52 | 2.96 | 4.14 |
| $C_2Cl_4$-a | 16.53 | 53.62 | 97.26 | 0.76 | 3.82 | 4.54 |
| $C_2Cl_4$-b | 55.55 | 70.11 | 99.19 | 0.00 | 1.79 | 0.81 |
| $C_2F_3Cl_3$-a | 29.86 | 67.50 | 98.44 | 0.00 | 2.07 | 2.00 |
| $H_2O$-a | 100 | 43.63 | 23.22 | — | — | — |

$C_4F_8ONCF_3$-a: $C_4F_8ONCF_3$ + Unidine DS-403 (Daikin co.)
$C_4F_8ONCF_3$-b: $C_4F_8ONCF_3$ + EFTOP EF-351 (Tohkem co.).
$C_4F_8ONCF_3$-c: $C_4F_8ONCF_3$ + Unidine DS-403 + EFTOP EF-351
$C_2Cl_4$-a: $C_2Cl_4$ + Aerosol OT (Anion,: Wako Pharmaceuticals co.) + Liponox NC-86 (Nonion:: Lion co.)
$C_2Cl_4$-b: $C_2Cl_4$ + Sanitone #8880 (Cation: Fabritech co.)
$C_2F_3Cl_3$-a: $C_2F_3Cl_3$ + Sanitone #8882 (Catrion: Fabritech co.)
$H_2O$-a: $H_2O$ + O,ldpal B (Anion, nonion: Bufa co.)

TABLE 4

Results of solvent Resistance Tests of special

| Special garments, etc./ Solvents | $C_4F_8ONCF_3$-c | $C_2F_2Cl_3$-a | $C_2Cl_4$-b |
|---|---|---|---|
| Polyvinyl chloroide | ○ | X | X |
| Flockprint | ○ | ○ | X |
| Transfer foilprint | ○ | Δ | X |
| Enamel coating | ○ | ○ | X |
| Pigmentprint | ○ | ○ | X |
| Water-proof finished cloth | ○ | ○ | X |
| Decorated with spangles | ○ | X | X |
| Natural gum | ○ | ○ | X |
| Polysyrene button | ○ | ○ | X |

○: No change
Δ: Slightly changed
X: Significantly changed (damaged)
$C_4F_8ONCF_3$-c: $C_4F_8ONCF_3$ + Unidine DS-403 + EFTOP EF-351
$C_2F_3Cl_3$-a: $C_2F_3Cl_3$ + Sanitone #8882
$C_2Cl_4$-b: $C_2Cl_4$ + Sanitone #8880

What is claimed:

1. Washing method for removing oily soil from an object stained therewith comprising contacting the object with a non-flammable washing agent composition comprising 0.001 to 30 parts of a fluorine-free absorbent which can absorb and capture oily soil and not less than 70 parts of perfluorocarbon liquid to remove the soil from the object.

2. Method of claim 1 wherein 0.01 to 30 parts of the absorbent are present.

3. Method of claim 1 wherein at least one of a non-flammable organic solvent, water or a surfactant is optionally present as an additive.

4. Method of claim 3 wherein the organic solvent is perchloroethylene.

5. Method of claim 3 wherein the absorbent is at least one oil absorbing polymer selected from the group consisting of oil absorbing polymers which are obtained by polymerization of monomer components containing not less than 50 wt % of monomers (A) with one polymerizing group in the molecule and mainly comprising a monomer with a solubility parameter (SP value) not higher than 9, polynorbornene, styrene butadiene copolymer and sulfonated ethylene propylene terpolymer.

6. Method of claim 5 wherein the oil absorbing polymer is obtained by polymerization of monomer components comprising not less than 96 wt % of the monomer (A) and not more than 4 wt % of the cross linking monomer (B) which contains at least 2 polymerizing unsaturated groups in the molecule.

7. Method of claim 6 wherein the monomer (A) contains at least one aliphatic hydrocarbon group containing 3–30 carbon atoms and mainly comprises an unsaturated compound (a) selected from the group consisting of alkyl (meth) acrylate, alkylaryl (meth) acrylate, alkyl (meth) acrylamide, alkylaryl (meth) acrylamide, fatty acid vinyl ester, alkyl styrene and α-olefin.

8. Method of claim 1 wherein the absorbent is at least one oil absorbing polymer selected from the group consisting of oil absorbing polymers which are obtained by polymerization of monomer components containing not less than 50 wt % of monomers (A) with one polymerizing group in the molecule and mainly comprising a monomer with a solubility parameter (SP value) not higher than 9, polynorbornene, styrene butadiene copolymer and sulfonated ethylene propylene terpolymer.

9. Method of claim 8 wherein the oil absorbing polymer is obtained by polymerization of monomer components comprising not less than 96 wt % of the monomer (A) and not more than 4 wt % of the cross linking monomer (B) which contains at least 2 polymerizing unsaturated groups in the molecule.

10. Method of claim 9 wherein the monomer (A) contains at least one aliphatic hydrocarbon group containing 3–30 carbon atoms and mainly comprises an unsaturated compound (a) selected from the group consisting of alkyl (meth) acrylate, alkylaryl (meth) acrylate, alkyl (meth) acrylamide, alkylaryl (meth) acrylamide, fatty acid vinyl ester, alkyl styrene and α-olefin.

11. Method of claim 1 wherein the perfluorocarbon liquid is a perfluoroalkane, perfluorocycloalkane or perfluoromorpholine compound.

12. Method of claim 11 wherein the perfluorocarbon liquid is a perfluoromorpholine compound.

13. Method of claim 1 wherein the object is thereafter separated from the washing composition such that the oily soil is absorbed and captured by the absorbent via the perfluorocarbon liquid as soil dispersing medium whereby to avoid redeposition of the oily soil on the object.

14. Washing method for removing oily soil from an object stained therewith comprising contacting the object with a non-flammable washing agent composition comprising 50–99.99 parts of fluorocarbon liquid, 0.01–30 parts of a fluorine-free absorbent which can absorb and capture oily soil and 0–20 parts of a non-flammable organic solvent.

15. Method of claim 14 wherein the organic solvent is perchloroethylene.

16. Method of claim 14 wherein at least one of water or a surfactant is optionally present as an additive.

17. Washing method for removing oily soil, water soluble soil and solid soil from an object stained therewith comprising contacting the object with a circulating flow of a non-flammable washing agent composition comprising 0.001 to 30 parts of a fluorine-free absorbent which can absorb and capture oily soil and not less than 70 parts of perfluorocarbon liquid, and at least one of a non-flammable organic solvent, water or a surfactant as an additive for removing water soluble soil and solid soil, in a washing zone to remove the soil from the object, such that the circulating flow upon leaving the washing zone is contacted with a separate content of the absorbent in a recycling zone to remove soil from the circulating flow of the washing agent composition prior to recirculation thereof to the washing zone whereby to cleanse the circulating flow of such soil.

* * * * *